US011244090B2

(12) United States Patent
Szpak et al.

(10) Patent No.: US 11,244,090 B2
(45) Date of Patent: Feb. 8, 2022

(54) SYSTEMS AND METHODS FOR EXTRACTING ADJUSTABLE ATTRIBUTES OF MODEL COMPONENTS

(71) Applicant: The MathWorks, Inc., Natick, MA (US)

(72) Inventors: Peter S. Szpak, Newton, MA (US); Biao Yu, Sharon, MA (US); Alongkrit Chutinan, Dover, MA (US)

(73) Assignee: The MathWorks, Inc., Natick, MA (US)

( * ) Notice: Subject to any disclaimer, the term of this patent is extended or adjusted under 35 U.S.C. 154(b) by 0 days.

(21) Appl. No.: 15/255,857

(22) Filed: Sep. 2, 2016

(65) Prior Publication Data
US 2017/0351789 A1    Dec. 7, 2017

Related U.S. Application Data

(60) Provisional application No. 62/344,192, filed on Jun. 1, 2016.

(51) Int. Cl.
*G06F 8/34* (2018.01)
*G06F 30/18* (2020.01)
*G06F 8/30* (2018.01)

(52) U.S. Cl.
CPC .............. *G06F 30/18* (2020.01); *G06F 8/34* (2013.01); *G06F 8/311* (2013.01)

(58) Field of Classification Search
CPC ............. G06F 17/5046; G06F 17/5022; G06F 17/5027; G06F 17/509; G06F 17/5009;
(Continued)

(56) References Cited

U.S. PATENT DOCUMENTS 4,796,179 A * 1/1989 Lehman .................... G06F 8/30
700/86
5,175,856 A * 12/1992 Van Dyke ................ G06F 8/41
711/E12.006
(Continued)

FOREIGN PATENT DOCUMENTS

JP    H11-353168 A    12/1999
JP    2009-238229 A   10/2009
(Continued)

OTHER PUBLICATIONS

Roberto Lublinerman and Stavros Tripakis, Modularity vs Reusability: Code Generation from Synchronous Block Diagrams, Apr. 11, 2008, IEEE Xplore [retrieved on Apr. 16, 2018]. INSPEC Accession No. 10278164.*
(Continued)

*Primary Examiner* — Boris Gorney
*Assistant Examiner* — David A Hopkins
(74) *Attorney, Agent, or Firm* — Cesari and McKenna, LLP; Michael R. Reinemann

(57) ABSTRACT

Systems and methods decouple model components from a model execution style for which the model components are created, and the model components may be utilized in parent models having different execution styles. A model component may be partitioned into executable entities, and the entry points of the executable entities and their call styles may be identified. An adaptation layer that includes access points for the entry points may be constructed. The model component, including the adaptation layer, may be included in the model, and connection elements of the parent model may be connected to the access points of the adaptation layer. The execution call styles associated with the connection elements of the parent model may be bound to the execution call styles of the entry points as originally designed. The adaptation layer may manage translation of
(Continued)

call styles and may coordinate scheduling of data communication with the model component.

37 Claims, 17 Drawing Sheets

(58) Field of Classification Search
CPC .......... G06F 17/5018; G06F 8/30; G06F 8/40; G06F 8/34
See application file for complete search history.

(56) References Cited

U.S. PATENT DOCUMENTS

| | | | |
|---|---|---|---|
| 6,609,248 B1* | 8/2003 | Srivastava | G06F 8/447 717/141 |
| 7,197,748 B2* | 3/2007 | Chaiken | G06F 8/52 717/136 |
| 7,340,684 B2* | 3/2008 | Ramamoorthy | G05B 19/0426 715/763 |
| 7,350,172 B1* | 3/2008 | Koh | G06F 30/30 716/136 |
| 7,463,263 B2* | 12/2008 | Gilboa | G06T 11/206 345/420 |
| 7,849,440 B1* | 12/2010 | Englehart | G06F 9/45504 715/762 |
| 7,882,488 B2* | 2/2011 | Zeidman | G06F 8/30 717/106 |
| 8,286,129 B2* | 10/2012 | Mani | G06F 8/34 717/105 |
| 8,423,981 B2* | 4/2013 | Hudson, III | G06F 8/34 717/140 |
| 8,448,130 B1 | 5/2013 | Pillarisetti et al. | |
| 8,566,804 B1* | 10/2013 | Carrick | G06F 9/5066 717/135 |
| 8,589,870 B2* | 11/2013 | Ogilvie | G06F 8/34 717/109 |
| 8,689,194 B1 | 4/2014 | Pillarisetti et al. | |
| 8,839,187 B1* | 9/2014 | Yan | G06F 8/423 717/104 |
| 8,930,881 B1* | 1/2015 | Eddins | G06F 8/34 717/100 |
| 8,990,783 B1* | 3/2015 | Yu | G06F 9/4887 717/131 |
| 9,032,380 B1 | 5/2015 | Ruthramoorthy et al. | |
| 9,128,783 B1* | 9/2015 | Warlock | G06F 9/542 |
| 9,135,143 B2* | 9/2015 | Correll | G06F 11/362 |
| 9,152,390 B1* | 10/2015 | Tripakis | G06F 8/36 |
| 9,304,838 B1 | 4/2016 | Warlock et al. | |
| 9,311,436 B2 | 4/2016 | Englehart et al. | |
| 9,536,023 B2 | 1/2017 | Englehart et al. | |
| 2004/0210592 A1* | 10/2004 | Ciolfi | G06F 8/34 |
| 2005/0160397 A1* | 7/2005 | Szpak | G06F 30/20 717/104 |
| 2007/0143095 A1 | 6/2007 | Yu et al. | |
| 2007/0169039 A1* | 7/2007 | Lin | G06F 8/34 717/146 |
| 2007/0261019 A1* | 11/2007 | Raghavan | G06F 9/449 717/105 |
| 2011/0320178 A1* | 12/2011 | Kumar | G06F 8/34 703/2 |
| 2013/0198713 A1* | 8/2013 | Zhang | G06F 8/10 717/106 |
| 2014/0344614 A1* | 11/2014 | Blasig | G06F 17/5031 713/501 |
| 2014/0359560 A1 | 12/2014 | Avadhanula et al. | |
| 2015/0058772 A1 | 2/2015 | Bator et al. | |
| 2015/0331979 A1* | 11/2015 | Englehart | G06F 8/34 703/2 |
| 2017/0286342 A1* | 10/2017 | Derler | G06F 13/366 |
| 2017/0351492 A1* | 12/2017 | Szpak | G06F 30/367 |

FOREIGN PATENT DOCUMENTS

| | | |
|---|---|---|
| JP | 2015-56140 A | 3/2015 |
| JP | 2016-506550 A | 3/2016 |
| WO | WO-2011/149553 A1 | 12/2011 |

OTHER PUBLICATIONS

Roberto Lublinerman and Stavros Tripakis, Modularity Code Generation from Triggered and Timed Block Diagrams, Jun. 27, 2008, IEEE Xplore [retrieved on Apr. 24, 2018]. INSPEC Accession No. 10060306.*
Roberto Lublinerman, Christian Szegedy, and Stavros Tripakis, Modular Code Generation from Synchronous Block Diagrams: Modularity vs Code Size, 2009, Berkeley Online Database, URL: https://people.eecs.berkeley.edu/~stavros/papers/popl09.pdf [retrieved on Apr. 17, 2018]. In POPL'09, pp. 78-89. ACM, 2009.*
S. Balasubramanian. Solutions for Mixed-Signal SoC Verification Using Real Number Models. Cadence Design Systems [Online, published 2013, retrieved Apr. 30, 2018]. URL: https://www.cadence.com/content/dam/cadence-www/global/en_US/documents/solutions/mixed-signal-verification-wp.pdf.*
IEEE Computer Society and the IEEE Standards Association Corporate Advisory Group. IEEE Standard for SystemVerilog—Unified Hardware Design, Specification, and Verification Language; Dec. 2012 [database online]. IEEE [retrieved on Apr. 26, 2018]. INSPEC Accession No. 13397047.*
Gerber, Richard, and Seongsoo Hong. "Compiling real-time programs with timing constraint refinement and structural code motion." IEEE Transactions on Software Engineering 21.5 (1995): 389-404. (Year: 1995).*
Koster, Lutz, Thomas Thomsen, and Ralf Stracke. Connecting Simulink to OSEK: Automatic code generation for real-time operating systems with Targetlink. No. 2001-01-0024. SAE Technical Paper, 2001. (Year: 2001).*
Haber, Arne, et al. "First-class variability modeling in Matlab/Simulink." Proceedings of the Seventh International Workshop on Variability Modelling of Software-intensive Systems. 2013. (Year: 2013).*
De Vries, Robert. "EuroSim Simulation Framework." DASIA 2003—Data Systems in Aerospace. vol. 532. 2003. (Year: 2003).*
Sandmann, Guido, and Michael Seibt. AUTOSAR-compliant development workflows: From architecture to implementation-tool interoperability for round-trip engineering and verification and validation. No. 2012-01-0962. SAE Technical Paper, 2012. (Year: 2012).*
Alexander, "AUTOSAR Seminar WS2008/2009—Assignment: Simulation of Automotive Systems in the Context of AUTOSAR", Mar. 31, 2009, Accessed via the webiste of the Hasso Plattner Institut at the University of Potsdam (Year: 2009).*
Fan, "Real-Time Embedded Systems", Feb. 2015, ISBN 9780128017180, (Year: 2015).*
Schulze, Michael, Jens Weiland, and Danilo Beuche. "Automotive model-driven development and the challenge of variability." Proceedings of the 16th International Software Product Line Conference—vol. 1. 2012. (Year: 2012).*
Stewart, David B. "Designing software components for real-time applications." Proceedings of Embedded System Conference. 2000. (Year: 2000).*
Cremona, Fabio, Matteo Morelli, and Marco Di Natale. "TRES: a modular representation of schedulers, tasks, and messages to control simulations in simulink." Proceedings of the 30th Annual ACM Symposium on Applied Computing. 2015. (Year: 2015).*
Arrieta, Aitor, Goiuria Sagardui, and Leire Etxeberria. "A comparative on variability modelling and management approach in simulink for embedded systems." V Jornadas de Computación Empotrada, ser. JCE 26-33 (2014). (Year: 2014).*
Cheng, Frank S., and Lin Zhao. "Developing a MATLAB-based control system design and analysis tool for enhanced learning environment in control system education." age 9 (2004): 2. (Year: 2004).*
Heinzemann, Christian, Jan Rieke, and Wilhelm Schafer. "Simulating self-adaptive component-based systems using MATLAB/

(56) References Cited

OTHER PUBLICATIONS

Simulink." 2013 IEEE 7th International Conference on Self-Adaptive and Self-Organizing Systems. IEEE, 2013. (Year: 2013).*

Merriam-Webster dictionary, definition of "comply", accessed Nov. 7, 2020 (Year: 2020).*

Cha, Minji, and Kyong Hoon Kim. "Automatic building of real-time multicore systems based on simulink applications." International Conference on Ubiquitous Computing and Multimedia Applications. Springer, Berlin, Heidelberg, 2011. (Year: 2011).*

Henriksson, Dan, Anton Cervin, and Karl-Erik Arzen. "TrueTime: Real-time control system simulation with MATLAB/Simulink." Proceedings of the Nordic MATLAB Conference. Copenhagen, Denmark, 2003. (Year: 2003).*

An, Ping, et al. "STAPL: An adaptive, generic parallel C++ library." International Workshop on Languages and Compilers for Parallel Computing. Springer, Berlin, Heidelberg, 2001. (Year: 2001).*

Butts, Ken, et al. "Usage scenarios for an automated model compiler." International Workshop on Embedded Software. Springer, Berlin, Heidelberg, 2001. (Year: 2001).*

"Embedded Coder © AUTOSAR," R2016a, The MathWorks, Inc., Mar. 2016, pp. 1-474.

Mjeda, Anila, et al., "The AUTOSAR Standard—The Experience of Applying Simulink According to Its Requirements," SAE International, Apr. 16, 2007, pp. 1-8.

Simulink®: User's Guide, R2016a, The MathWorks, Inc., Mar. 2016, pp. 1-3840.

Sung, Kisoon, et al., "Development Process for Autosar-based Embedded System," International Journal of Control and Automation, vol. 6, No. 4, Aug. 2013, pp. 29-38.

"Notification of Transmittal of the International Search Report and the Written Opinion of the International Searching Authority, or the Declaration," International Filing Date: May 30, 2017, International Application No. PCT/US2017/035021, Applicant: The MathWorks, Inc., dated Aug. 29, 2017, pp. 1-13.

Bishop, Robert H., "LabVIEW 2010 Programming Guide," ASCII Media Works, vol. 1, Mar. 7, 2011, pp. 10-11, 74-83.

Sato, Masahiro, et al., "Practical Example of Model Driven Development Using UML," Design Wave Magazine, CQ Publishing Co., Ltd., vol. 12, No. 2, Feb. 1, 2007, pp. 141-149.

* cited by examiner

SYSTEMS AND METHODS FOR EXTRACTING ADJUSTABLE ATTRIBUTES OF MODEL COMPONENTS

CROSS-REFERENCE TO RELATED APPLICATIONS

This application claims the benefit of Provisional Patent Application Ser. No. 62/344,192, filed Jun. 1, 2016, for Systems and Methods for Creating Model Adaptors, which application is hereby incorporated by reference in its entirety.

BRIEF DESCRIPTION OF THE DRAWINGS

The description below refers to the accompanying drawings, of which.

DETAILED DESCRIPTION OF ILLUSTRATIVE EMBODIMENTS

Figure 1:
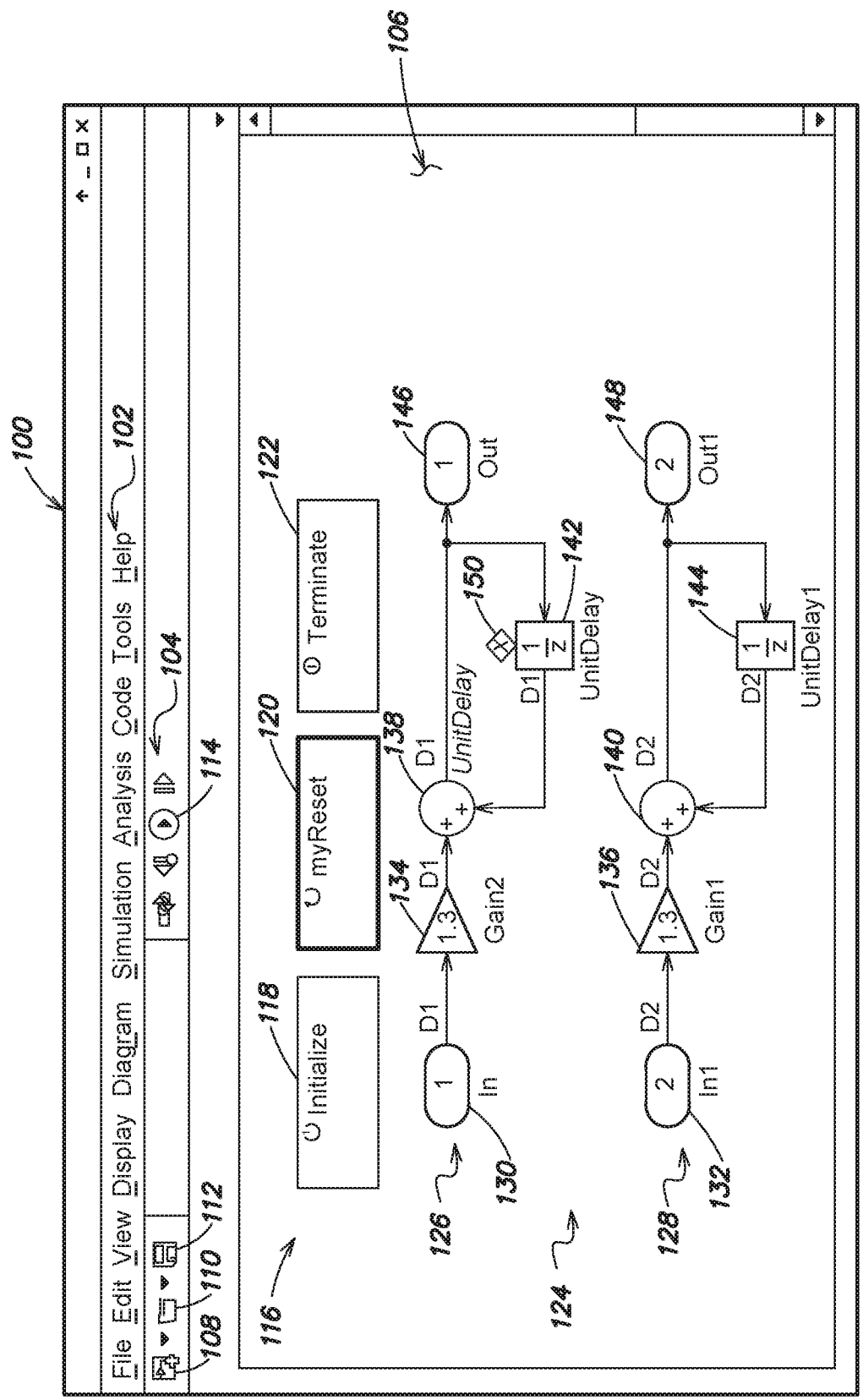
FIG. 1 is a schematic illustration of an example model editor window presenting a model component in accordance with an embodiment.

Graphical models may be used to simulate types of physical systems, such as discrete systems, event-based systems, time-based systems, state-based systems, data flow-based systems, etc. A model may include model elements, such as blocks, that perform operations when the graphical model is executed. The blocks may be connected together using connection elements to define an algorithm or procedure that represents the behavior of the system being modeled. Model elements may represent elemental dynamic systems, states, junctions, physical components, etc. Connection elements may represent signals, state transitions, events, physical connections, dataflow, control flow, function calls, etc. The model may be constructed and executed within a graphical modeling environment, which may be an application program running on a work station or other data processing device.

A given model may simulate, e.g., approximate the operation of, a system. Exemplary systems include physical systems, such as weather systems, financial markets, plants, controllers, etc. A model may be executed in order to simulate the system being modeled, and the execution of a model may also be referred to as simulating the model.

The modeling environment may implement a declarative language. A declarative language is a language that expresses the logic of a computation without describing its control flow. A declarative language may describe what a program must accomplish in terms of the problem domain, rather than describe how to accomplish it as a sequence of the programming language primitives. In some cases, a declarative language may implement single assignment in which variables are assigned once and only once. Examples of declarative languages include the Simulink® model-based design environment from The MathWorks, Inc. of Natick, Mass., the Modelica modeling language from the Modelica Association, and the LabVIEW graphical programming system from National Instruments Corp., Hardware Description Language (HDL), the Prolog language, and the Haskell language, among others. Behaviors of at least some of the model elements and connection elements of a model may include computational implementations that are implicitly defined by a declarative language.

A graphical model may include multiple hierarchical levels. For example, groups of model elements may be organized as model components that establish hierarchy in the model. Exemplary components include subsystems, sub-models, sub-Virtual Instruments (sub-VIs), etc. At a first hierarchical level, a group of model elements may be represented by a single block, such as a subsystem block or a model reference block. A component may itself include other components, establishing multiple hierarchical levels within the model. A component, such as a subsystem, may be saved in a library, and may be reused at other locations in the model or in other models. The execution behavior of a subsystem may be context dependent. That is, at least some of the parameters of the group of model elements included in a component, such as data type, data dimension, and sample time, may be undefined. Values for these parameters may be inherited from the model in which the subsystem is executed. In some implementations, execution of the subset of model elements of a subsystem may be interleaved with the execution of other model elements of the model. In other implementations, the subset of model elements of a subsystem may execute atomically. In addition, in some implementations, a subsystem may be configured for conditional execution, and the subsystem may execute when the condition is satisfied. Examples of conditionally executed subsystems include triggered, enabled, action and iterator, triggered and enabled, and function call.

A sub-model also may include a group of model elements, and may be represented at a given hierarchical level by a single model reference block. A sub-model also may be saved in a library, and reused at other locations in the model or in other models. The execution behavior of a sub-model may be independent of the model in which it is located, and the model elements of a sub-model may execute as a unit.

A dynamic model may run at one or more rates. For example, a model may include a first portion running at a first rate, and a second portion that runs at a second rate that might be faster than the first rate. The model elements of the first portion may be executed in a first task, while the model elements of the second portion may be executed in a second task, which may be assigned a higher priority than the first task.

At times, it may be desirable to implement code from some or all of a graphical model on a target platform once a model has been designed. For example, a user may develop a graphical model on a workstation. When the model is complete and models the behavior of the system correctly, the user may generate code for the model. The generated code may include one or more entry-point functions, and execution of the generated code may be invoked by calling the entry-point functions. For a single rate model, a step( ) function may defined in the generated code. The step( ) function may be periodically called, e.g., at the rate specified in the model. For a model having multiple rates, separate step( ) functions may be defined, e.g., one for each rate.

A user may wish to execute a model on a target device in real-time, such as a real-time hardware platform or environment. Real-time execution may be implemented in different ways by target devices. For example, a target device may include a real-time operating system (RTOS). In such a case, the model may need to execute within a determined time interval on the target so that the target can perform processing operations in real-time (e.g., processing data from a running system without falling behind over time). A RTOS may utilize a hardware clock to provide timing services needed to run a program in real time. The generated code may include tasks that execute portions of the model, and the tasks may be scheduled for execution by the real-time operating system. Other targets may use Interrupt Service Routines (ISRs) or other mechanisms to implement real-time execution.

Users may employ different modeling styles for creating graphical models, such as a rate-based multitasking modeling style and a function-call-based modeling style. In the rate-based multitasking modeling style, a model as originally designed may include portions that execute at different periodic rates. For example, a model may include model elements that provide input data, such as Inport blocks, Constant blocks, etc., that are configured to operate at one or more rates. Rate transition blocks may be used to handle data transfers between the model portions operating at different rates. In the function-call-based modeling style, a model may include function-call components and/or model elements. A modeling environment may analyze a model and implicitly determine when to call the model's entry points, such as when during execution of the model and/or at what rate during execution of the model.

A particular modeling style may be chosen based on the run-time environment of the target device on which code generated for the model is intended to be run. For example, if an environment supports rate-based interrupts, the rate-based multitasking modeling style may be used. In some cases, a model may have more than one modeling style.

A model created in one modeling style may not easily be converted to another modeling style. For example, changes to the model itself may be required to convert the model from one modeling style to another. To convert from rate-based to function-call based, model elements that define the model's behavior may need to be grouped into conditional subsystems or sub-models. Making changes to a model can create delays in some product design flows. For example, in some design flows, models may be subject to extensive verification and other testing, especially for models that implement safety or mission-critical functionality. If changes are made to such a model, the modified model must be subjected to the entire verification process, which can cause significant delays in product design.

A model may include a plurality of hierarchical levels, and each hierarchical level may be represented by or may include one or more model components. Systems and methods of the present disclosure may analyze the model components included in a model starting with the model component at the lowest hierarchical level. The systems and methods may partition a model component into its executable entities. The systems and methods also may identify entry points for the executable entities, relationships and constraints that exist and apply to execution of the executable entities, the types of services utilized by the executable entities, data handling requirements and a data latency scheme of the executable entities. The systems and methods may store information regarding the entry points, relationships, constraints, services, latency, and data handling requirements in an adaptation layer for the model component. This information may be aggregated or combined with similar information generated and stored in an adaptation layer for a next higher hierarchical level, e.g., for a parent model component that includes the model component for which the adaptation layer was created. However, the adaptation layer neither specifies nor limits how executable entities may be invoked, or how the types of services are to be provided. The manner by which the executable entities are invoked, and the particular way in which the types of services are provided are adjustable.

At one or more hierarchical levels, an interface may be provided that exports the entry points of the adaptation layer for the one or more hierarchical levels. A given interface may include access points that correspond to the entry points for the executable entities. User-specified scheduling logic may be associated with the access points. For example, model elements selected and configured by the user may be linked to the access points by connection elements. The model elements may collectively define scheduling logic for scheduling execution of the executable entities. The scheduling may specify the sequencing of the executable entities. The adaptation layer may determine whether the user-specified scheduling logic satisfies the relationships and constraints determined for the current hierarchical level and any lower hierarchical levels aggregated into the current hierarchical level. The adaptation layer may bind the scheduling logic, which specifies a particular manner of invoking the executable entities, to the entry points. For example, the adaptation layer may match entry points of the component to the executable entities that the scheduling logic executes. The adaptation layer may determine whether the scheduling logic also provides the types of services utilized by the executable entities. If not, the adaptation layer logic may provide the services, for example in cooperation with the modeling environment.

The scheduling logic, which may be used to invoke the entry points does not alter the functional behavior of the model component. Additionally, the scheduling logic may utilize a call style that differs from the call style for which the model component was originally designed. For example, the entry points of the interface for the adaptation layer may be neutral with regard to call style. The adaptation layer may translate the relationships and constraints from the call style for which the model component was originally designed to the call style of the scheduling logic bound to the entry points of the executable entities. Accordingly, the systems and methods allow a model component to be utilized in other levels of a model hierarchy that utilize call styles that differ from the one for which the model component was originally designed.

The model component and the adaptation layer may be included in a parent model or in a parent model component (which in turn may be included in a model). Elements of the parent model or the parent model component may be connected to the access points of the adaptation layer interface. The elements may represent user-selected functionality that explicitly defines when the model's executable entities are called. The adaptation layer thus allows user control over the execution schedule of the model component. The systems and methods may bind the functionality and the call style of the elements of the parent model or the parent model component to the entry points to the model component. The systems and methods may also check that the relationships, constraints, or limitations are not violated by the functionality and call styles of the elements of the parent model or parent model component that are connected to the access points, and thus control execution of the executable entities. The parent model or the parent model component may be executed, for example within a modeling environment. The adaptation layer may manage translation of the call styles between the parent model or the parent model component and the model component. The adaptation layer may also coordinate the execution of the model component with the exchange of data with the model component. Alternatively or additionally to execution, code for the parent model or the parent model component, including the model component and the bindings between execution call styles, may be generated.

FIG. 1 is a schematic illustration of an example model editor window 100, which may be generated by a modeling environment and presented on a display of a data processing system. The model editor window 100 may include a plurality of graphical affordances, such as user interface elements and/or windows elements (widgets), at least some of which may be operated by a user to construct, edit, run, and save a model, among other operations. For example, the model editor window 100 may include a menu bar 102, a toolbar 104, and a canvas 106. The menu bar 102 may include a plurality of commands, and the commands may be organized into drop-down categories, such as File, Edit, View, Display, etc. The toolbar 104 may include a plurality of graphical command buttons for executing frequently used commands. For example, the toolbar 104 may include a New button 108, an Open button 110, a Save button 112, and a Run button 114, among others.

A user may select model element types from one or more libraries, and add instances of the selected model element types to the canvas 106 to construct or revise a model. At least some of the selected model elements may be graphical elements. A model may have portions operating according to different execution domains, such as a time-based or dynamic portion, a state-based portion, a dataflow based portion, a control flow portion, an event based portion, a message-based portion, etc. For example, a model may include a graphical state-based component, such as a chart.

A graphical model component 116 having executable semantics may be opened and presented on the canvas 106. The model component 116 may implement Power Up Power Down (PUPD) functionality, and may include an initialize subsystem 118, a reset subsystem 120 (labeled 'myReset'), a terminate subsystem 122, and an algorithmic model portion 124. The algorithmic model portion 124 may compute an estimated position, for example the estimated position of a car, based on the car's speed. The algorithmic model portion 124 may include a plurality of interconnected model elements. The model elements that form the algorithmic model portion 124 may be arranged along two separate, e.g., unconnected, pathways 126 and 128 through the algorithmic model portion 124. The pathways 126 and 128 may each include an Inport block 130 and 132, a Gain block 134 and 136, a Sum block 138 and 140, a Unit Delay block 142 and 144, and an Outport block 146 and 148. The Sum blocks 138 and 140 and the Unit Delay blocks 142 and 144 may implement the functionality of a discrete integrator, e.g., in the form of an accumulator. One or more of the model elements of the algorithmic model portion 124 may include internal state. For example, the Unit Delay block 142 may include an internal state variable, x, which may be graphically represented on the Unit Delay block 142 by state variable icon 150. The state variable, x, may represent a current or starting position of the car, and may be obtained from a sensor.

The algorithmic model portion 124 may represent a multirate, dynamic system, and may be implemented using a rate-based multitasking modeling style. In particular, the pathways 126 and 128 may execute at different rates. For example, the pathway 126 may execute at a periodic rate of 1 second, while the pathway 128 may execute at a periodic rate of 2 seconds. The Inport block 130 of the pathway 126 may be configured with a sample time of 1 second, and the other model elements of the pathway 126 may inherit their sample times. The Inport block 132 of the pathway 128 may be configured with a sample time of 2 seconds, and the other model elements of the pathway 128 may inherit their sample times.

The initialize subsystem 118, the myReset subsystem 120, and the terminate subsystem 122 may execute during initialize, reset, and terminate phases, respectively, of the execution of the model component 116. For example, the subsystems 118, 120, and 122 may be event-triggered subsystems that listen for an event, such as an initialize event, a reset event, and a termination event. The subsystems 118, 120, and 122 may include user-specified functionality, e.g., explicit operations, that execute in response to the occurrence of the respective event.

In some embodiments, explicit initialize, reset, or terminate operations may be defined within a model component in other ways besides including them in conditionally executed subsystems. For example, explicit initialize, reset, or terminate operations may be implemented using other components or containers, such as conditionally executed sub-models. In some embodiments, explicit initialize, reset, or terminate operations may be defined without the use of subsystems, sub-models, or other components or containers.

A partitioning engine may analyze the model component 116, and identify the different executable entities that form the model component 116. In some implementations, the executable entities may be a subsystem, a sub-model, or a group of model elements. The partitioning engine may construct or examine an execution graph of the model component 116. The partitioning engine may identify five partitions of the model component 116: the initialize subsystem 118, the myReset subsystem 120, the terminate subsystem 122, the pathway 126, and the pathway 128.

In some embodiments, a window, such as a partition legend dialog, may be generated and presented, for example on the model editor window 100. The partition legend dialog may provide information concerning the executable entities identified by the partitioning engine.

Figure 2:
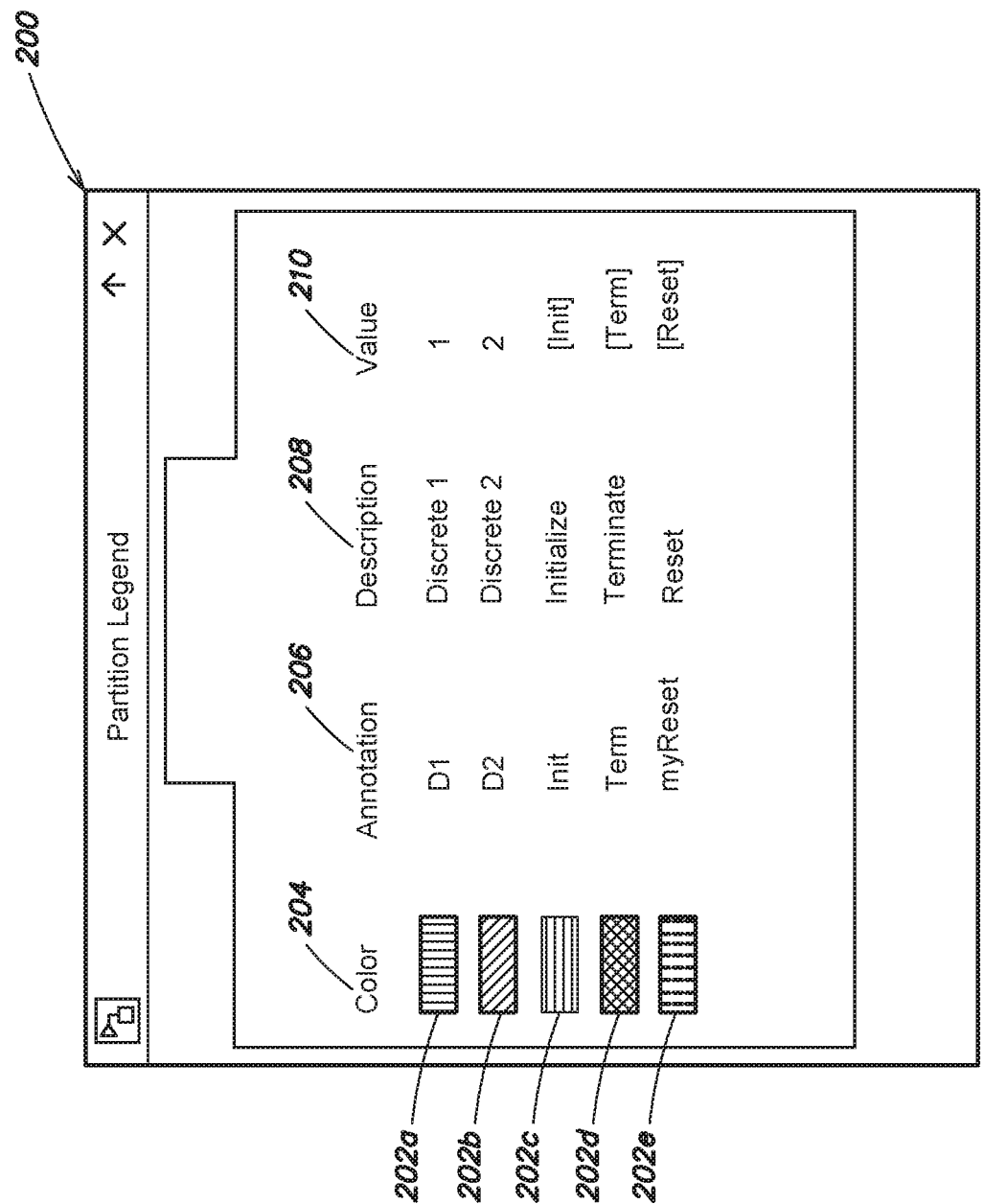
FIG. 2 is a schematic illustration of an example user interface window in accordance with an embodiment.

FIG. 2 is a schematic illustration of an example user interface window, which may be in the form of a partition legend dialog 200, in accordance with an embodiment. The information presented in the partition legend dialog 200 may be arranged as a table having a plurality of rows and columns whose intersections define records or cells containing data. For example, the partition legend dialog 200 may include a plurality of rows 202a-e where each row corresponds to an entry point of a particular executable entity of the model component 116. The partition legend dialog 200 also may include a color column 204, an annotation column 206, a description column 208, and a value column 210. The partitions may be represented on the model component 116 using color-coding and annotations. The particular colors and annotations used on the model component 116 for the different partitions may be included in the color column 204 and the annotation column 206 of the partition legend dialog 200. The description column 208 may include information identifying the call style of the partition, and the value column 210 may indicate a value for the call style of the partition.

For example, row 202a indicates that the pathway 126 is colored red and annotated with the label 'D1', and the call style is a discrete sample time whose value is 1 relative to other sample times. Row 202b indicates that the pathway 128 is colored green and annotated with the label 'D2', and the call style is a discrete sample time whose relative value is 2. Row 202c indicates that the initialize subsystem 118 is colored blue and annotated with the label 'Init' (if the initialize subsystem 118 were opened), the call style is triggered, and the value of the trigger is [Init]. Row 202d indicates that the terminate subsystem 122 is colored orange and annotated with the label 'Term' (if the terminate subsystem 122 were opened), the call style is triggered, and the value of the trigger is [Trig]. Row 202e indicates that the myReset subsystem 120 is colored purple and annotated with the label 'myReset' (if the myReset subsystem 120 were opened), the call style is triggered, and the value of the trigger is [Reset].

It should be understood that other graphical affordances besides color may be utilized.

Figure 3:
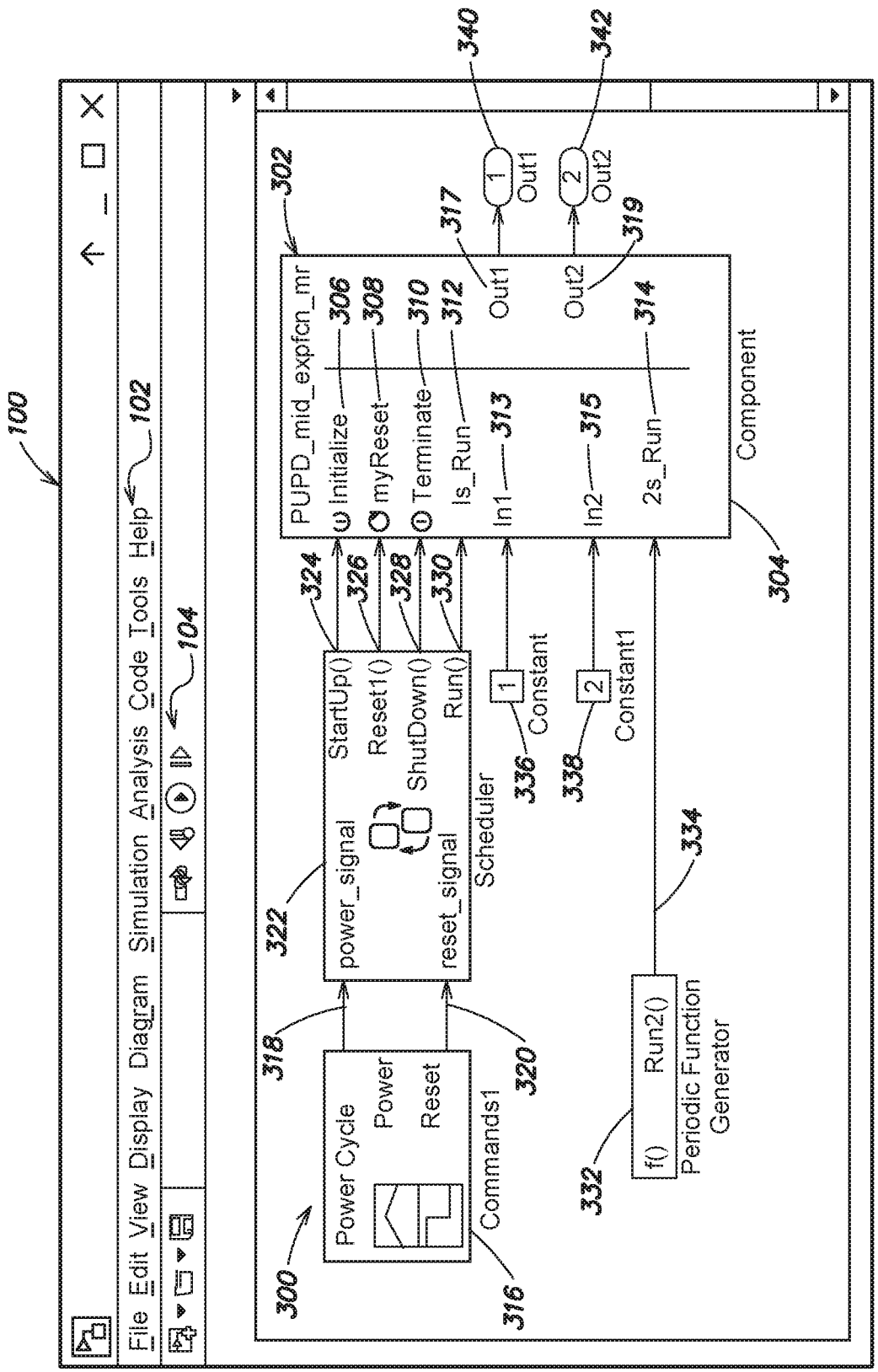
FIG. 3 is a schematic illustration of an example parent model that includes the example model component of FIG. 1 in accordance with an embodiment.

FIG. 3 is a schematic illustration of an example parent model 300 that may be opened in the model editor window 100. The parent model 300 includes the model component 116, which is represented in the parent model 300 by a model reference block 302. The model reference block 302 includes a graphical affordance, which may be in the form of an adaptation layer interface 304 that includes access points corresponding to adjustable attributes determined for the model component 116 by the partitioning engine. For example, the adaptation layer interface 304 may include an initialize access point 306, a myReset access point 308, a Terminate access point 310, a 1 s_Run access point 312, and a 2 s_Run access point 314. One or more of the access points may be implemented as call sites from which the executable entities of the model component 116 may be called for execution. Other access points may be implemented in other ways.

In some embodiments, the adaptation layer interface 304 also may include access points or other ports or entry points for services utilized by an executable entity, and for data communication with the model component 116. For example, the adaptation layer interface 304 may include two data input access points 313 and 315 corresponding to the Inport blocks 130 and 132, and two data output access points 317 and 319 corresponding to the Outport blocks 146 and 148. If a model component utilizes other input data, such as data from a Constant block, a Data Store Memory read block, or other source block, access points may be provided for such input data. Logic may be connected to such access points, for example to change the value of the Constant block or the memory location of the Data Store Memory read block.

The presentation of the model component 116 with an adaptation layer interface may represent a second presentation form for the model component 116 as compared to a presentation form, such as a subsystem or sub-model block, without an adaptation layer interface.

The parent model 300 may implement a function-call-based modeling style. For example, the parent model 300 may include model elements that issue function calls, and at least some of these model elements may be used to schedule the execution of the execution entities of the model component 116. For example, model elements of the parent model 300 may be associated, e.g., graphically or logically, with the access points 306-314 of the adaptation layer interface 304 of the model reference block 302. Specifically, the parent model 300 may include a Signal Builder block 316 that, during execution of the parent model 300, sources a Power signal 318 and a Reset signal 320, and a state chart (Scheduler) 322 that receives the Power signal 318 and the Reset signal 320 from the Signal Builder block 316. The Scheduler state chart 322 may issue a plurality of function calls, during execution of the parent model 300. For example, Scheduler state chart 322 may issue a StartUp( ) function call 324, a Reset( ) function call 326, a ShutDown( ) function call 328, and a Run( ) function call 330. The parent model 300 also may include a function generator block 332 that issues a Run2( ) function call 334.

The StartUp( ) function call 324 of the Scheduler state chart 322 may be connected to the initialize access point 306 of the adaptation layer interface 304. In response, a mapping engine may bind the StartUp( ) function call 324 to the initialize event. The Reset( ) function call 326 of the Scheduler state chart 322 may be connected to the myReset access point 308 of the adaptation layer interface 304. In response, the mapping engine may bind the Reset( ) function call 326 to the reset event. The ShutDown( ) function call 328 of the Scheduler state chart 322 may be connected to the terminate access point 310 of the adaptation layer interface 304. In response the mapping engine may bind the ShutDown( ) function call to the terminate event. The Run( ) function call 330 of the Scheduler state chart 320 may be connected to the 1 s_Run access point 312 of the adaptation layer interface 304. In response, the mapping engine may bind the Run( ) function call 330 to the 1 second discrete sample time of the algorithmic model portion 124. The Run2( ) function call 332 of the function generator block 332 may be connected to the 2 s_Run access point 314 of the adaptation layer interface 304. In response, the mapping engine may bind the Run2( ) function call 334 to the 2 seconds discrete sample time of the algorithmic model portion 124.

The parent model 300 also may include two Constant blocks 336 and 338 that may be connected to the In1 and In2 access points 313 and 315. The parent model 300 may further include two Outport blocks 340 and 342 that may be connected to the Out1 and Out2 access points 317 and 319.

The parent model 300 may be executed. During execution, function calls are issued by model elements of the parent model 300. These function calls are used to invoke execution of the executable entities of the model component 116. Alternatively or additionally, code may be generated for the parent model 300. The generated code may include code representing the adaptation layer where function calls of the parent model 300 are used to invoke execution of the executable entities of the model component 116. Furthermore, if the adaptation layer exposed an access point for a Constant block initially set to, e.g., '1', and the value of the Constant block is changed, for example by logic connected to the access point, the generated code may include the new value for the Constant block.

Even though the model component 116 (FIG. 1) was originally designed using a rate-based multitasking modeling style, the parent model 300 invokes execution of the model component 116 using a function-call-based modeling style. Nonetheless, no changes were made to the model component 116 affecting its algorithmic behavior to allow its re-use within a model having a different modeling style. Furthermore, by creating an adaptation layer for a model component, the execution of the model component can be explicitly defined, e.g., by a user, by connecting logic or functionality, e.g., in the form of model elements, to the adaptation layer interface. In this way, the user can control execution of the model component, rather than relying on the simulation to execute the model component implicitly. The addition of an adaptation layer interface to a model component may result in a platform-independent version of the model component. By connecting logic, for example model elements from a higher hierarchical level, to the adaptation interface layer, a particular platform environment, such as a real-time environment, may be specified for the model component. In addition, services utilized by executable entities of the model component may be modeled, for example by logic included in the model. Furthermore, input data utilized by the model component, such as through a Constant block or other source block, may be changed, for example by logic included in the model.

Figure 4:
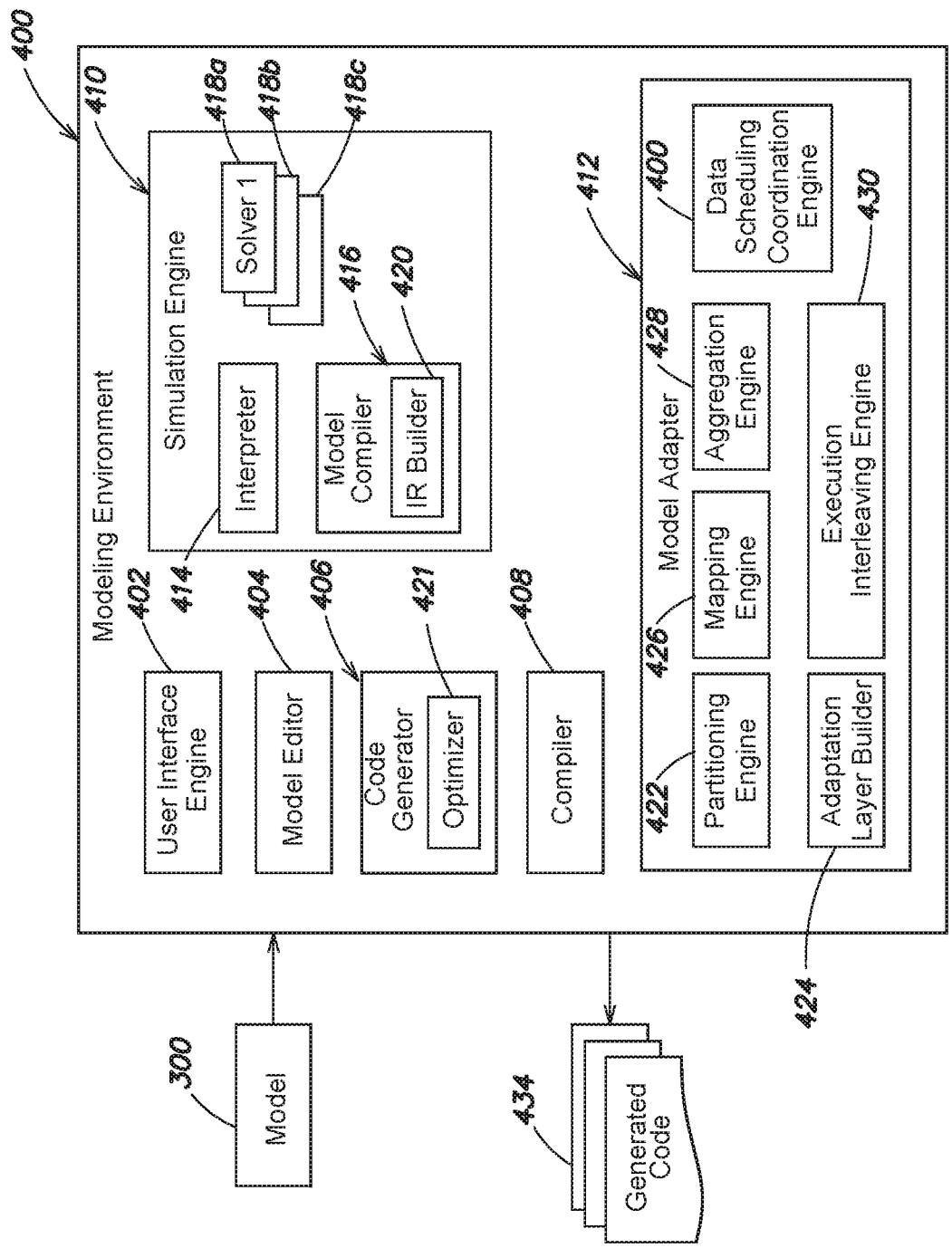
FIG. 4 is a partial, schematic illustration of an example modeling environment in accordance with an embodiment.

FIG. 4 is a partial, schematic illustration of an example modeling environment 400 in accordance with an embodiment. The modeling environment 400 may include a User Interface (UI) engine 402, a model editor 404, a code generator 406, a compiler 408, a simulation engine 410, and a model adaptor 412. The UI engine 402 may create and present one or more User Interfaces (UIs), such as Graphical User Interfaces (GUIs) and/or Command Line Interfaces (CLIs), on the display of a workstation, laptop, tablet, or other data processing device. The GUIs and CLIs may provide a user interface to the modeling environment 400, such as the model editing window 100. The model editor 404 may perform selected operations on a model, such as open, create, edit, and save, in response to user inputs or programmatically.

The simulation engine 410 may include an interpreter 414, a model compiler 416, and one or more solvers, such as solvers 418a-c. The model compiler 416 may include one or more Intermediate Representation (IR) builders, such as IR builder 420. In some implementations, one or more IR builders may be included or associated with the solvers 418. The code generator 406 also may include an optimizer 421.

The model adaptor 412 may include a partitioning engine 422, an adaptation layer builder 424, a mapping engine 426, an aggregation engine 428, an interleaving engine 430, and a data scheduling coordination engine 432.

The modeling environment 400 may access a computer-based, executable graphical model or a model component, such as the parent model 300 (FIG. 3) and/or the model component 116 (FIG. 1). The simulation engine 410 may execute, e.g., compile and run or interpret, the model using one or more of the solvers 418a-c. Exemplary solvers include one or more fixed-step continuous time solvers, which may utilize numerical integration techniques, and one or more variable-step solvers, which may for example be based on the Runge-Kutta and Dormand-Prince pair. With a fixed-step solver, the step size remains constant throughout simulation of the model. With a variable-step solver, the step size can vary from step to step, for example to meet error tolerances. A non-exhaustive description of suitable solvers may be found in the *Simulink User's Guide* from The MathWorks, Inc. (March 2016 ed.)

The code generator 406 may generate code, such as code 434, for the model 300. For example, the user interface engine 402 may provide or support a Code Generation button in a GUI that may be selected by the user, or the user interface engine 402 may receive a code generation command entered by the user, e.g., in the GUI or the CLI. The code generation command also may be invoked programmatically, for example, when a particular event occurs. In response to the code generation command being activated, the code generator 406 may generate code, such as the code 434, for the model 300. The behavior of the generated code 434 may be functionally equivalent to the behavior of the executable model 300.

The generated code 434 may be textual code, such as textual source code, that may be compiled, for example by the compiler 408, and executed on a target machine or device, which may not include a modeling environment and/or a simulation engine. The generated code 434 may conform to one or more programming languages, such as Ada, Basic, C, C++, C#, SystemC, FORTRAN, VHDL, Verilog, a vendor or target specific HDL code, such as Xilinx FPGA libraries, assembly code, etc. The generated code 434 may include header, main, make, and other source files. The compiler 408 may compile the generated code for execution by target hardware, such as a microprocessor, a Digital Signal Processor (DSP), etc. In some embodiments, the generated code 434 may be accessed by a hardware synthesis tool chain, which may configure a programmable hardware device, such as a Field Programmable Gate Array (FPGA), a System on a Chip (SoC), etc., from the generated code 434. The model 300 and the generated code 434 may be stored in memory, e.g., persistent memory, such as a hard drive or flash memory, of a data processing device. The modeling environment 400 may be loaded into and run from the main memory of a data processing device.

In some implementations, the code generator 406 and/or the compiler 408 may be separate, such as separate application programs, from the modeling environment 400. The code generator 406 and/or the compiler 408 may also be run on different data processing devices than the data processing device running the modeling environment 400. In such embodiments, the code generator 406 may access the model 300, e.g., from memory, and generate the code 434 for the model 300, for example without interacting with the modeling environment 400.

In some embodiments, one or more of the user interface engine 402, the model editor 404, the code generator 406, the compiler 408, the simulation engine 410, and the model adaptor 412 may be implemented through one or more software modules or libraries containing program instructions that perform the methods described herein. The software modules may be stored in a memory, such as a main memory, a persistent memory and/or a computer readable media, of a workstation, server, or other data processing machine or device, and executed by one or more processors. Other computer readable media may also be used to store and execute these program instructions, such as non-transitory computer readable media, including optical, magnetic, or magneto-optical media. In some embodiments, one or more of the user interface engine 402, the model editor 404, the code generator 406, the compiler 408, the simulation engine 410, and the model adaptor 412 may comprise hardware registers and combinational logic configured and arranged to produce sequential logic circuits. In some embodiments, various combinations of software and hardware, including firmware, may be utilized to implement the described methods.

The modeling environment 400 may create computational implementations of portions of a model or a model component based on the semantics of the model elements included in the model portions. The computational implementations may have a behavior as specified in the design of the model portions. The model adaptor 416 may identify the entry points for the computational implementations, and present graphical affordances for the entry points. User specified logic, for example model elements, may be connected to these graphical affordances. The user specified logic may explicitly invoke execution of the computational implementations. Furthermore, the user specified logic may implement a call style that differs from the call style of the model portions.

Figure 5A:
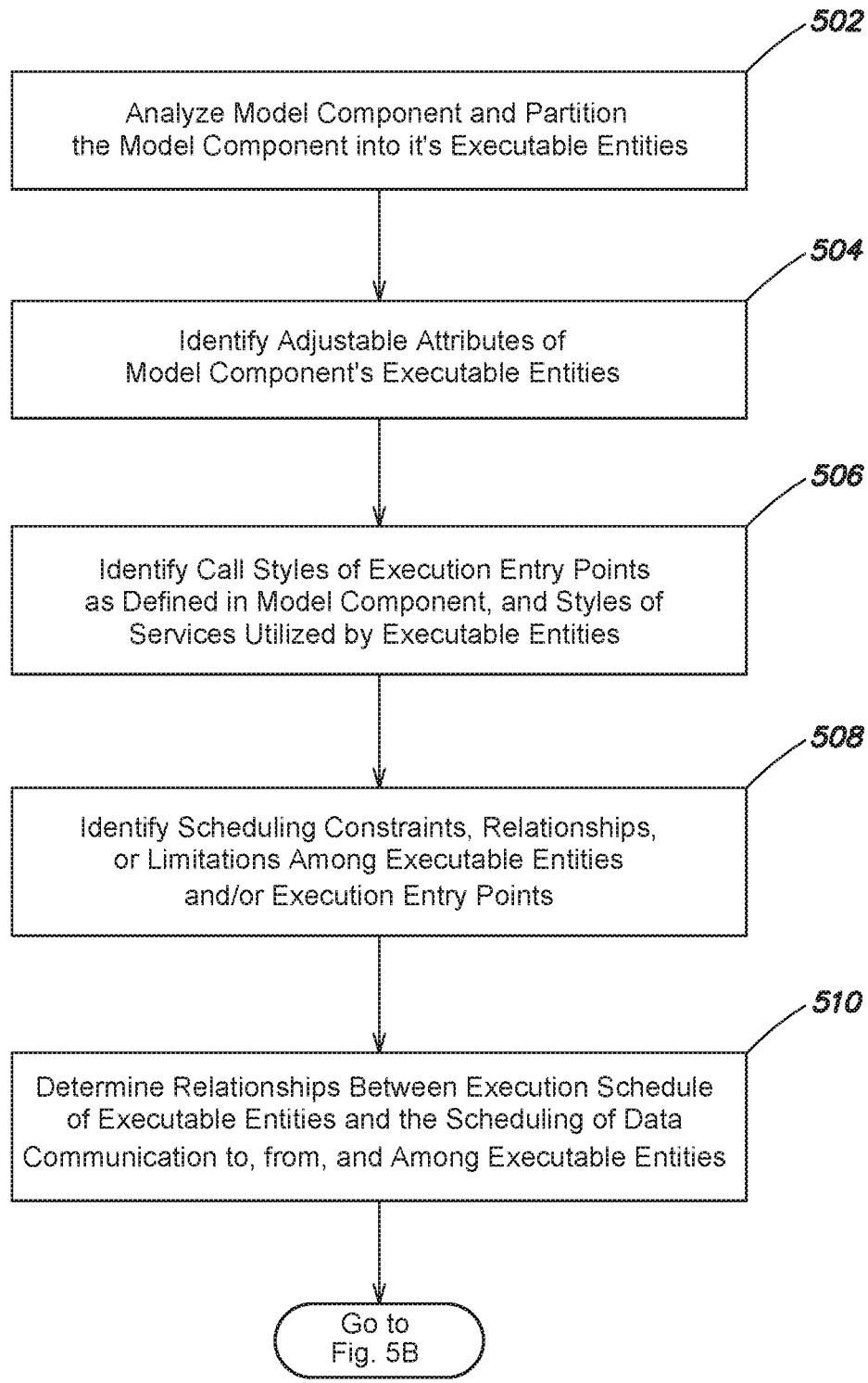
FIGS. 5A and 5B are partial views of a flow diagram of an example method in accordance with an embodiment.
Figure 5B:
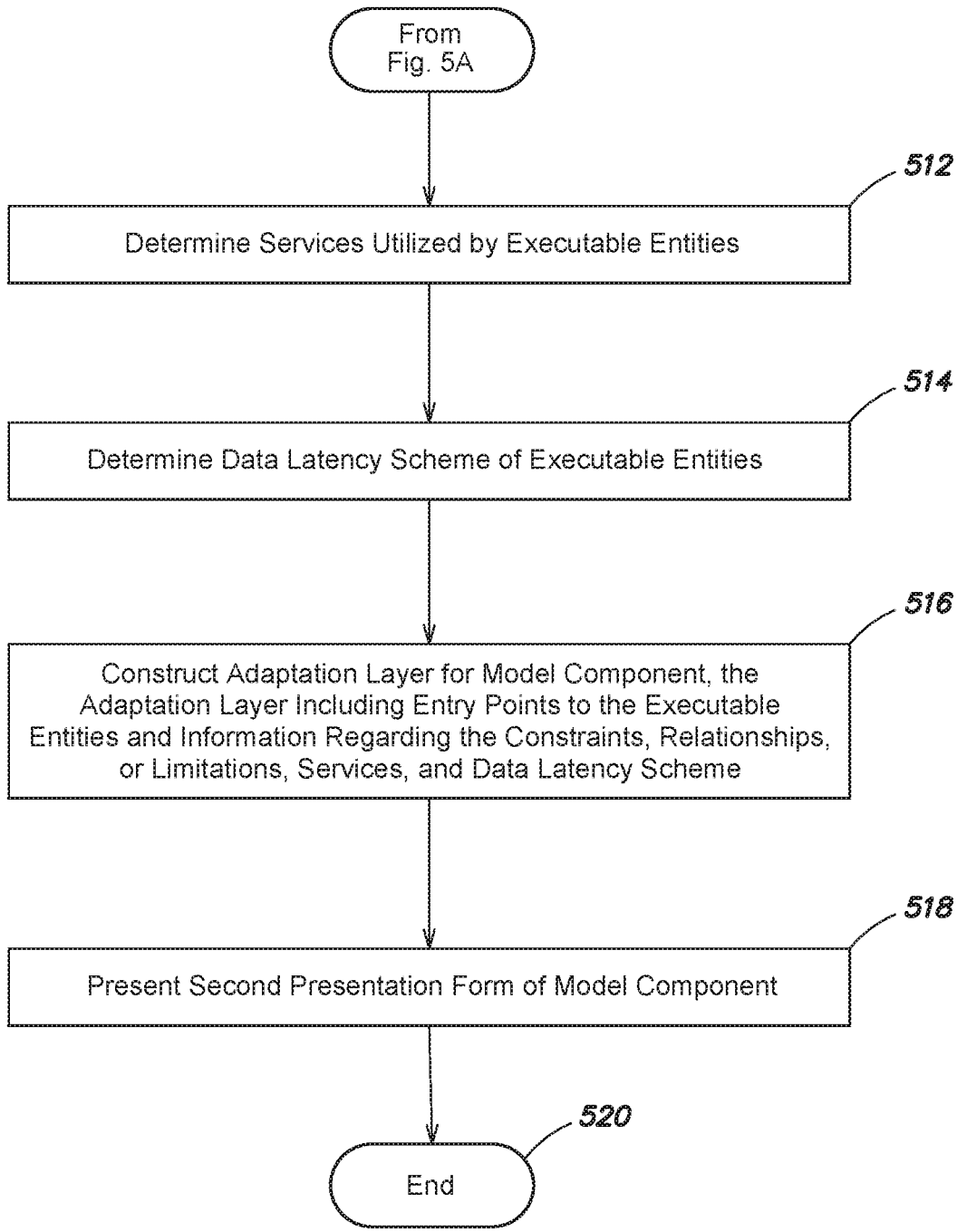

FIGS. 5A and 5B are partial views of a flow diagram of an example method for creating an adaptation layer in accordance with an embodiment. The partitioning engine 422 may analyze a model component, and partition the model component into its executable entities, as indicated at step 502. For example, the partitioning engine 422 may construct or access a dependency graph of the model component. The dependency graph may include information concerning the operations or procedures included in the model component and the data and/or control dependencies among those operations or procedures.

Figure 6:
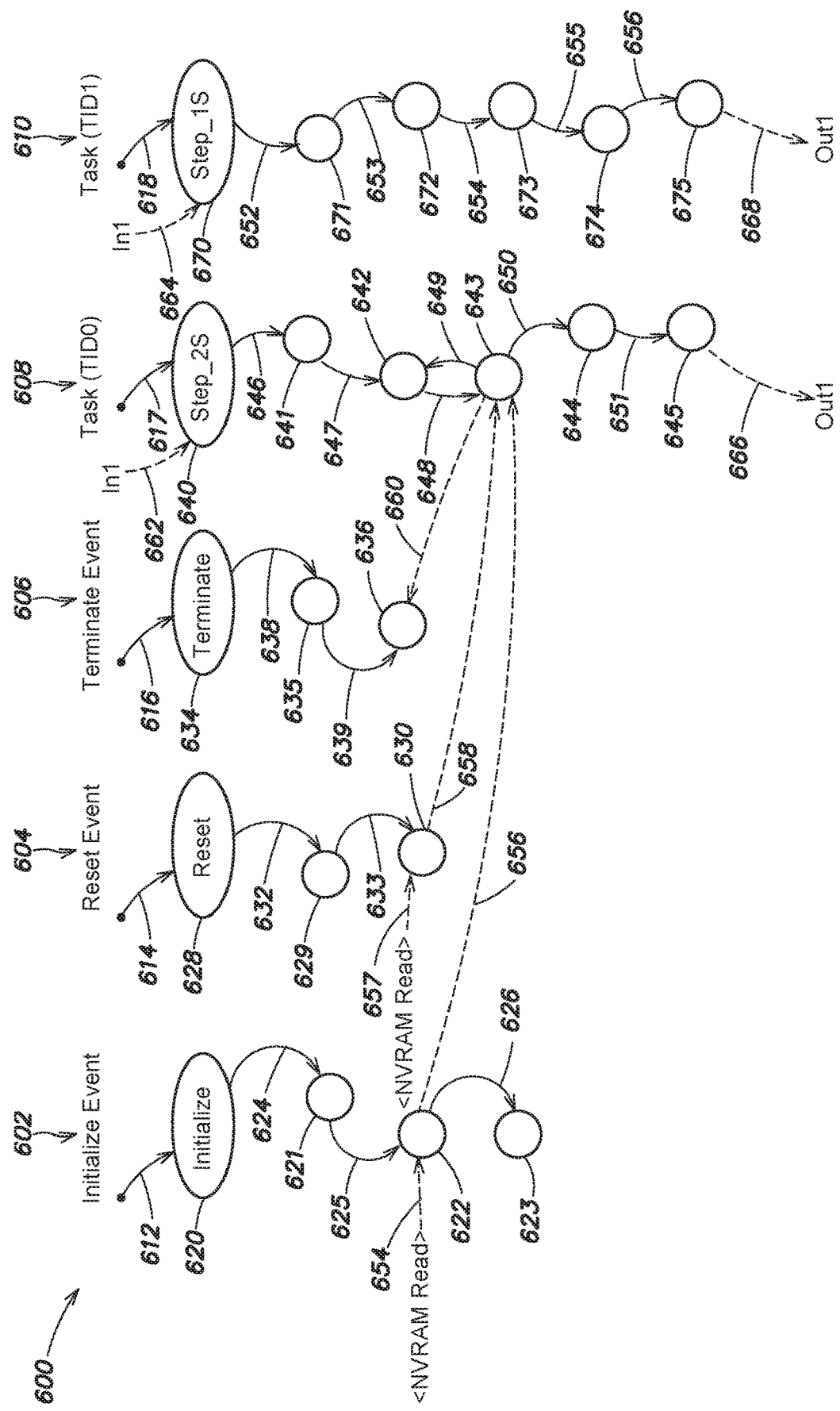
FIG. 6 is a schematic illustration of an example dependency graph for a model component in accordance with an embodiment.

FIG. 6 is a schematic illustration of an example dependency graph 600 that may be constructed (or accessed) by the partitioning engine 422 for a model component. The dependency graph 600 may include a plurality of sub-graphs that correspond to the executable entities of the model component. For example, the dependency graph 600 may include an initialize sub-graph 602, a reset sub-graph 604, a terminate sub-graph 606, and two task-based sub-graphs 608 and 610. Each sub-graph may include one or more entry points. For example, the initialize sub-graph 602 may be event-based, and may include an initialize event entry point 612. The reset sub-graph 604 may be event-based, and may include a reset event entry point 614. The terminate sub-graph 606 may be event-based, and may include a terminate event entry point 616. The first task sub-graph 608 may be run by a task assigned task identifier 0 (tid0), and include a task entry point 617. The task tid0 may be run periodically, e.g., every two seconds. The second task sub-graph 610 may be run by a task assigned task identifier 1 (tid1), may include a task entry point 618, and may be run periodically, e.g., every second. The sub-graphs may further include one or more nodes representing operations of the respective executable entity, and the nodes may be interconnected by arcs representing execution flow.

For example, the initialize sub-graph 602 may include nodes 620-623 interconnected by arcs 624-626. Reset sub-graph 604 may include nodes 628-630 and arcs 632 and 633. Terminate sub-graph 606 may include nodes 634-636 and arcs 638 and 639. The first task sub-graph 608 may include nodes 640-645 and arcs 646-651. The second task sub-graph 610 may include nodes 670-675 and arcs 652-656.

Data received or produced by a sub-graph may be represented on the dependency graph. For example, node 622 of the initialize sub-graph 602 may read data from memory, e.g., NVRAM, as indicated by dashed arrow 654, and provide data to node 643 of the step_2 s sub-graph 608 as indicated by dashed arrow 656. Node 630 of the reset sub-graph 604 also may read data from memory, e.g., NVRAM, as indicated by dashed arrow 657, and provide data to node 643 of the first task sub-graph 608 as indicated by dashed arrow 658. Node 643 may provide data to node 636 of the terminate sub-graph 606, as indicated by dashed arrow 660. Node 640 of the first task sub-graph 608 may receive data, e.g., In1, from an entity outside of the dependency graph 600, as indicated by dashed arrow 662. Node 646 of the second task sub-graph 610 may receive data, e.g., In1, from an entity outside of the dependency graph 600, as indicated by dashed arrow 664. In addition, node 645 of the first task sub-graph 608 and node 651 of the second task sub-graph 610 may provide data to entities outside of the dependency graph 600, as indicated by dashed arrows 666 and 668.

It should be understood that the dependency graph 600 of FIG. 6 is meant for illustrative purposes, and that other graphs and/or textual representations may be constructed and/or evaluated.

The partitioning engine 422 may identify the executable entities of a model component by examining the dependency graph 600. For example, a sub-graph that is independent of any other sub-graph, e.g., a sub-graph that does not include an arc to another sub-graph, may be identified as an executable entity.

In some embodiments, the dependency graph 600 may be constructed by the IR builder 420.

Returning to FIG. 5, the partitioning engine 422 may identify adjustable attributes of the model component's executable entities, for example by analyzing the dependency graph 600, as indicated at step 504. Adjustable attributes may include entry points of the model component's executable entities, services utilized by the executable entities, and input data processed by the executable entities. The partitioning engine 422 also may identify the call styles associated with the entry points for the model component as originally designed, and the styles of services utilized by the executable entities, as indicated at step 506. The partitioning engine 422 may identify the call styles by examining the dependency graph 600. For example, the dependency graph 600 indicates that the executable entities corresponding to sub-graphs 602, 604, and 606 are event-based, while the executable entities corresponding to sub-graphs 608 and 610 are periodic task-based.

The partitioning engine 422 may determine whether any relationships, constraints, or limitations exist among the entry points of the executable entries, as indicated at step 508. For example, by examining the tasks associated with the sub-graphs 608 and 610, the partitioning engine 422 may determine that task tid1 runs at a sample time of 1 s, while task tid0 runs at a sample time of 2 s. The partitioning engine 422 may conclude that task tid1 needs to run at twice the rate of task tid0. The partitioning engine 422 may store the determined relationships, constraints, or limitations in memory.

Other exemplary relationships or constraints include:
1. Task A must start (or complete) before (or after) Task B starts (or completes);
2. Tasks A and B must be mutual exclusive;
3. Task A must start (or finish) before (or after) all other tasks start (or complete);
4. A first group of Tasks must start (or complete) before (or after) a second group of tasks start (or complete);
5. First and second groups of tasks must be mutually exclusive;

6. Task A can preempt B;
7. Task A is not preemptable;
8. A memory read must happen before a write within a given task or between two or more tasks; or
9. Every read must be followed by a write.

The partitioning engine 422 also may determine the relationships between the scheduled execution of a model component's executable entities, and the schedule of data communication to, from, or among the executable entities, as indicated at step 510. For example, the data scheduling coordination engine 432 may analyze the executable entity, and determine that the executable entity utilizes input data, for example as indicated by a data input model elements, such as an Inport block, a Data Store Memory read block, a Constant block, or other source block.

The partitioning engine 422 also may analyze the executable entities and determine whether the executable entities utilize services, as indicated at step 512 (FIG. 5B). Exemplary services that may be utilized by an executable entity include timing services, error handling services, and data transfer services. For example, the partitioning engine 422 may determine that an executable entity utilizes a current time upon execution, or a time since last execution, e.g., a delta Time value. In some cases, the partitioning engine 422 may determine that an executable entity accesses data as a service, reads and/or writes data shared with another executable entity, etc.

Additionally, the data scheduling coordination engine 432 may determine a data latency scheme for one or more of the executable entities, as indicated at step 514. A data latency scheme may indicate a latency between the invoking of an executable entity and the retrieval of input data utilized by that executable entity. For example, suppose a component includes a rate-based executable entity scheduled to execute once every time unit, e.g., second, millisecond, microsecond, etc., and that at each execution, the executable entity receives new input data. The data scheduling coordination engine 432 may determine or retrieve a permissible latency between the invoking of the executable entity and the retrieving of the new input data. The data scheduling coordination engine 432 also may determine or retrieve a permissible latency between when the execution of an executable completes, and when output data produced by the executable entity is available. In some implementations, the data scheduling coordination engine 432 may use one or more default latency values for input and output data. In some embodiments, the default latency values may be replaced with user-specified values. For example, a user-settable latency option may be provided, and a desired value specified programmatically or through one or more entries in an option setting dialog. The permissible latencies may be organized into a latency scheme for the model component, and the latency scheme may be included in the adaptation layer.

In some embodiments, an executable entity may specify a latency behavior, which may be obtained by the data scheduling coordination engine 432.

The more latency that can be tolerated by an executable entity between the running of the executable entity and the retrieval of input data or the issuance of output data, the more efficient the execution of the executable entity will be. For example, more parallelism may be utilized if the latency is greater.

The adaptation layer builder 424 may construct an adaptation layer for the model component, as indicated at step 516. In some embodiments, an adaptation layer may be constructed for a model component programmatically, e.g., in response to a command. For example, a user may enter a command in a CLI for constructing an adaptation layer. In some embodiments, a property may be associated with a model component, and an adaptation layer may be created automatically based on the value of the setting, e.g., True or False. The value of the property may be specified programmatically or through one or more entries of an option setting dialog associated with the model component. In some embodiments, an adaptation layer may be constructed when a model component is saved, for example to a library for subsequent reuse. The adaptation layer may include access points for the entry points of the model component's executable entities. The adaptation layer also may include information on the constraints, relationships, or limitations, on the execution of the executable entities, and one or more data latency schemes for input data received by the model component and output data generated by the model component.

In some embodiments, the adaptation layer also may include information on services, such as a timing service or a delta time service, utilized by the executable entities. In some implementations, the adaptation layer may provide one or more of the services, such timing or delta time services, to an executable entity.

The adaptation layer builder 424 may present a second presentation form of the model component, as indicated at step 518. For example, the adaptation layer builder 424 may include an adaptation layer interface having one or more access points with a graphical representation of the model component, e.g., as presented on a canvas of a model editor window. The model component as presented without an adaptation layer interface may be a first presentation form of the model component. The model component in both the first and second presentation forms may be executable.

Processing may then complete, as indicated by End step 520.

Figure 7A:
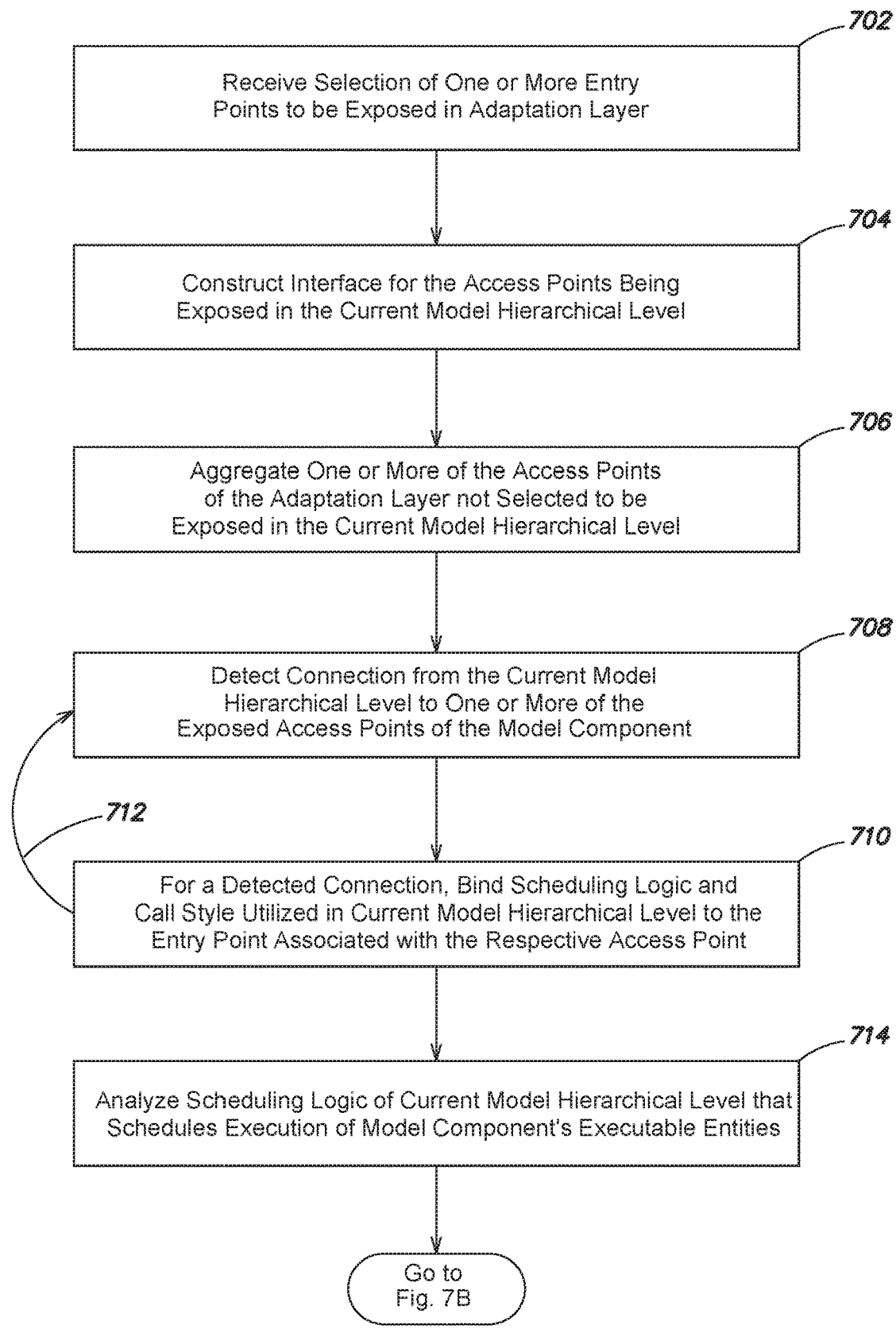
FIGS. 7A-7C are partial views of a flow diagram of an example method in accordance with an embodiment.
Figure 7B:
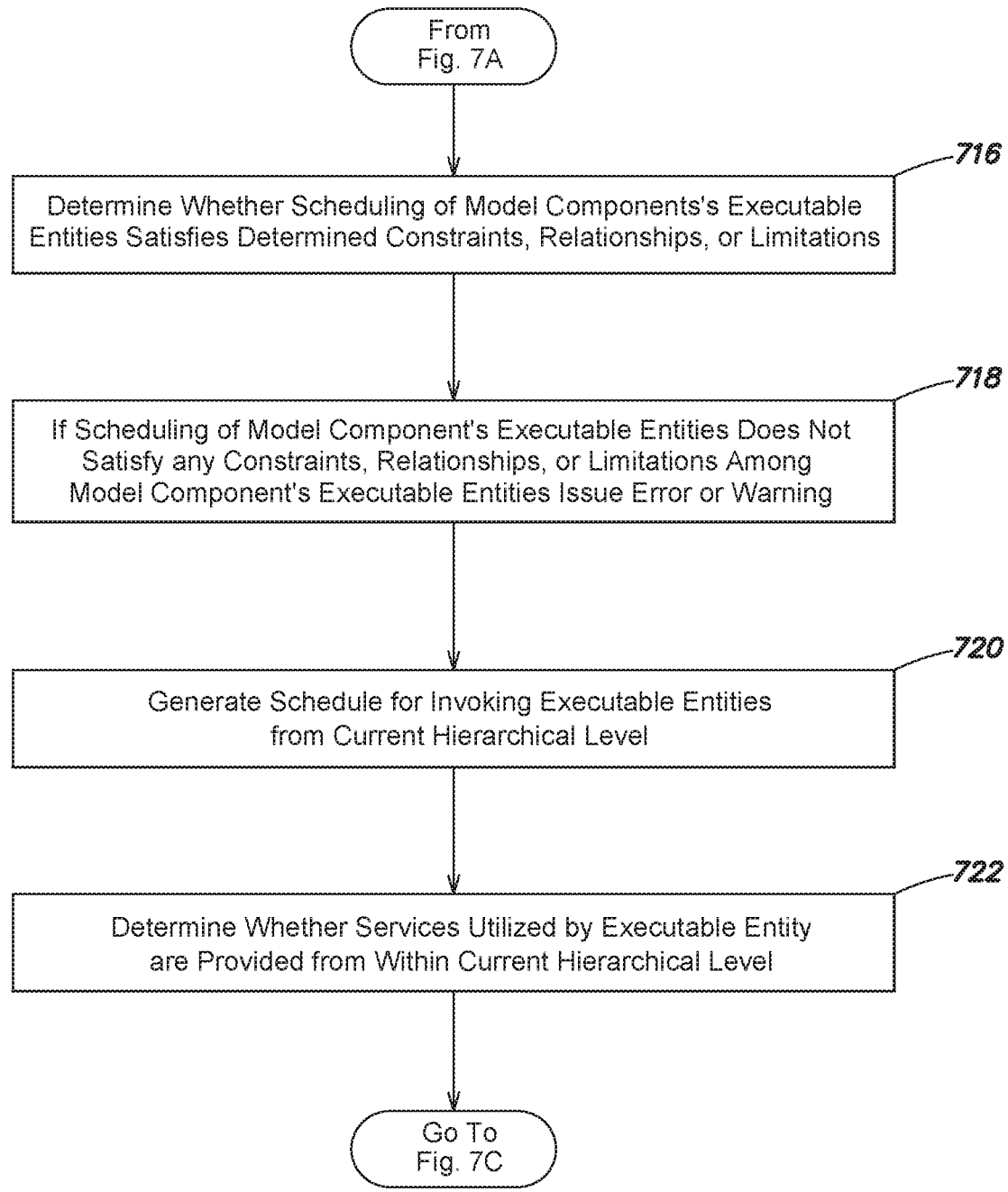
Figure 7C:
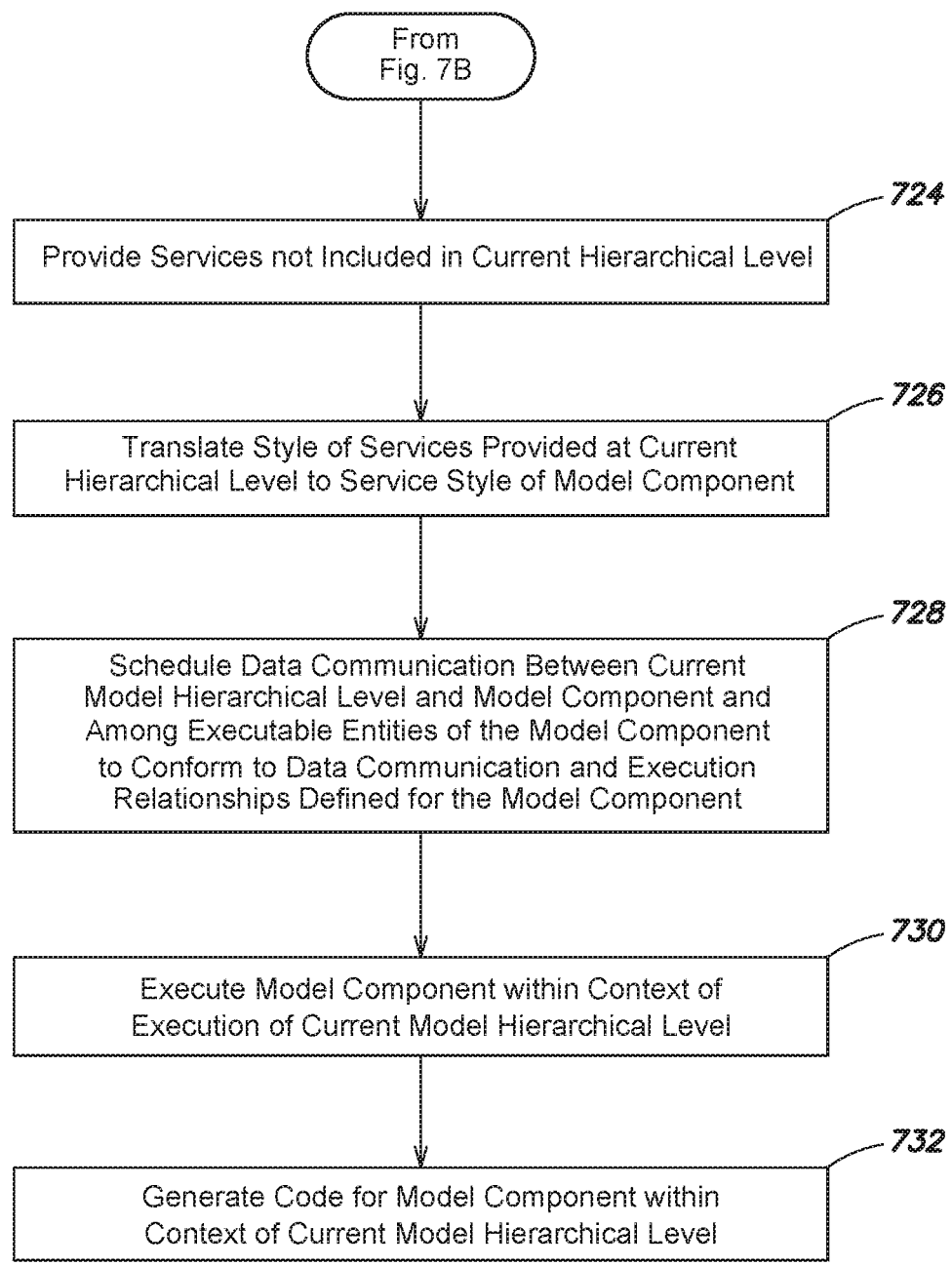

FIGS. 7A-7C are partial views of a flow diagram of an example method for utilizing an adaptation layer in accordance with an embodiment.

A model component for which an adaptation layer was created may be included in a parent model or a parent model component. The model adaptor 412 may receive an indication to expose within the parent model or parent model component one or more access points of the adaptation layer, as indicated at step 702. The indication may be specified by a user, e.g., textually or graphically. For example, a user may select the model component, e.g., with a mouse click or another command. In response, a user interface window, such as a dialog, may be presented that includes a listing of commands available for the model component. One of the commands included in the listing may be a 'Construct Adaptation Interface' command. In response to the selection of the 'Construct Adaptation Interface' command, a window, such as a pop-up dialog may be presented in the model editor window.

Figure 8:
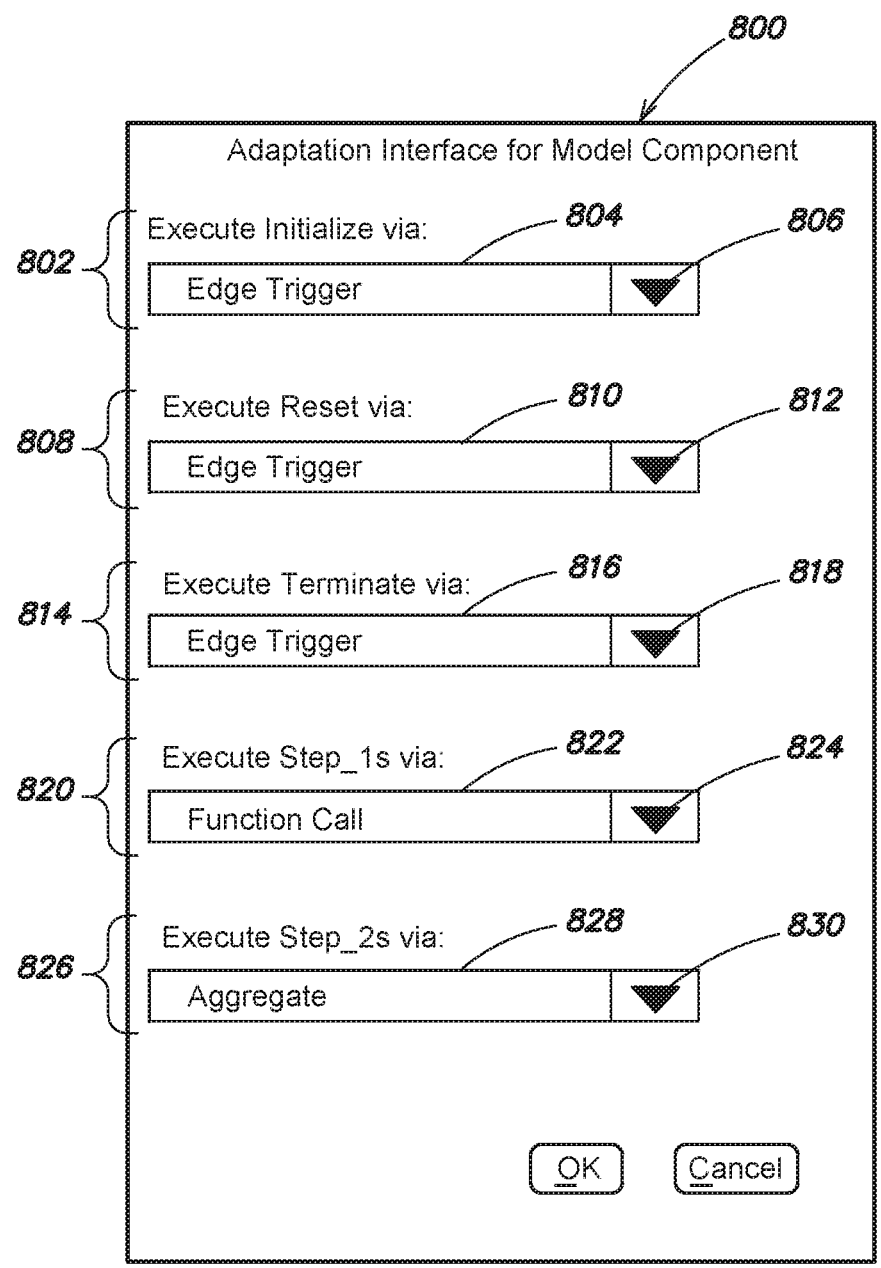
FIG. 8 is a schematic illustration of an example user interface window in accordance with an embodiment.

FIG. 8 is a schematic illustration of an example window 800 for use in constructing an adaptation interface in accordance with an embodiment. The window 800 may be in the form of a pop-up dialog, and may include a plurality of data entry fields for receiving indications concerning the access points of the model component's adaptation layer. In some implementations, the dialog 800 may include one or more entries for each executable entity of the model component. The entries may receive textual information indicating whether the access point for the respective executable entity is to be exposed, and, if so, the call style for the access point.

Selected access points may be exposed at a current hierarchical level, at some other hierarchical level, or at another model location.

For example, the dialog 800 may include an entry 802 for an initialize executable entity. The entry 802 may include a text box 804 for receiving an indication whether to expose an access point for use in invoking the initialize executable entity from the current hierarchical level, and for receiving information regarding the call style to be used to invoke the initialize executable entity. In some implementations, the text box 804 may include a drop down arrow 806, which if selected may present a list of available call styles to invoke the initialize executable entity from the current hierarchical level. Exemplary call styles that may be presented include Edge Trigger, Function Call, and Implicit Task. Edge Trigger may refer to a call style that utilizes a rising, e.g., 0 to 1, and/or falling, e.g., 1 to 0, control signal, event, or other data. Function Call may refer to a call style that invokes, e.g., calls, a function. The term Task may refer to an attribute of the access point including periodic, e.g., time-based, or aperiodic, e.g., initialization, reset, and terminate. Implicit Task may indicate that an access point is not to be exposed for the respective executable entity at a next higher hierarchical level, and that the access point may instead be implicitly combined with the access point of another executable entity that has the same task attributes in the parent model. It should be understood that other call styles may be presented.

The entry 802 is configured to expose the access point for the initialize executable entity, and to associate it with an edge trigger call style. The dialog 800 may further include an entry 808 for a reset executable entity, and the entry 808 may include a text box 810 with a drop down arrow 812. The entry 808 is configured to expose the access point for the reset executable entity, and to associate it with an edge trigger call style. The dialog 800 also may include an entry 814 for a terminate executable entity that includes a text box 816 with a drop down arrow 818. The entry 814 is configured to expose the access point for the terminate executable entity, and to associate it with an edge trigger call style. The dialog 800 further includes an entry 820 for a Step_1 s executable entity, and the entry 820 may include a text box 822 with a drop down arrow 824. The entry 822 is configured to expose the access point for the Step_1 s executable entity, and to associate it with a function-call call style. The dialog 800 may include an entry 826 for a Step_2 s executable entity that includes a text box 828 with a drop down arrow 830. The entry 826 is configured not to expose the access point for the Step_2 s executable entity, and instead to aggregate this access point with one or more access points of the parent model or parent model component.

If an entry point is exported in a parent model, for example as implicit, the execution sequence may be automatically determined by analyzing execution frequency and data dependency information, e.g., in the adaptation layer. For example, the executable entity may be executed in a task with the same execution frequency in the parent model. Inside the task, the executable entity may be executed based on data or control dependencies, e.g., it may be executed after model elements that provide data to the executable entity, and before model elements that that consume results computed by the executable entity.

In some embodiments, executable entities may be triggered through one or more explicit events, such as function calls or messages, or implicit events, such as trigger signals or periodic timers.

Returning to FIG. 7A, the adaptation layer builder 424 may construct an adaptation layer interface for the model component as included in the parent model or the parent model component, as indicated at step 704. The adaptation interface may expose the selected access points, e.g., with reference to FIG. 8, the access points for the initialize, reset, terminate, and Step_1 s executable entities. The aggregation engine 428 may aggregate the access points that were marked for aggregation, as indicated at step 706. For example, the access point may be combined with the access point of a higher level of the model hierarchy, and be exposed at a higher hierarchical level.

The model adaptor 412 may detect that a connection from the parent model or parent model component is made to an exposed access point of the adaptation interface, as indicated at step 708. For the detected connection, the mapping engine 426 may bind the functionality and call style used in the parent model or parent model component, which may be user-specified, to the entry point of the respective executable entity, as indicated at step 710. The detection of connections and the binding of functionality and call styles may be repeated as connections are made to other exposed access points, as indicated by loop back arrow 712. The model adaptor 412 may analyze the logic included in the parent model or the parent model component, for example as represented by model elements of the parent model or parent model component, for invoking execution of the executable entities of the model component, as indicated at step 714.

Adjustable attributes of an adaptation layer may be set or configured in other ways besides or including scheduling or other logic connected to exposed adjustable attributes.

In some embodiments, the adaptation layer builder 424 (or the IR builder 420) may construct a call graph for the parent model or parent model component that includes the model component. The call graph may represent the calling relationship between the parent model or parent model component and the model component. The call graph indicates the manner by which the parent model or parent model component calls the executable entities of the model component. The call graph may indicate the particular call styles used by the parent model or parent model component to call the executable entities of the model component. For example, the call graph may indicate that the parent model or parent model components use a function-call to call a first executable entity, and a trigger to call a second executable entity.

The model adaptor 412 may determine whether any conflicts exist between the scheduling of executable entities by the logic of the parent model or parent model component, and the relationships, constraints, or limitations determined for execution of the model component's executable entities, as indicated at step 716 (FIG. 7B). If a conflict is detected, the model adaptor 412 may issue an error or warning, as indicated at step 718. For example, the UI engine 402 may present an error or warning message on the model editor window 100.

The adaptation layer may generate a schedule for executing the executable entities of the model component, as indicated at step 720. To determine a schedule, the adaptation layer may consider:
1. the call style(s) implemented by the parent model or parent model component, and the call style(s) of the executable entities of the model component;
2. the scheduling logic included in the parent model or parent model component that invokes execution of the executable entities of the model component.

The schedule generated by the adaptation layer may apply to the call style of the parent model or parent model component, as opposed to the call style of the model component. For example, where the parent model implements a function-call call style and the model component implements rate-based, multitasking call style, the schedule generated by the adaptation layer may schedule the function calls. The adaptation layer also handles invoking the executable entities of the model component that were originally defined for a rate-based, multitasking call style, in response to the function calls of the parent model.

The adaptation layer may determine whether services utilized by an executable entity are provided to the component, for example from the current hierarchical level, as indicated at step 722. For example, suppose a model component utilizes a time service during execution. Further, suppose the model component is being executed in a manner that simulates how the model component would execute on a real-time platform or environment. A user may include logic that models a timing service by the real-time platform or environment. For example, the user may include a Counter or a Timer block in the current hierarchical level that is configured to simulate a timing service of the real-time platform or environment. The adaptation layer may determine that the Counter or Timer block simulates the timing service utilized by the executable entity.

To the extent one or more services utilized by an executable entity are not explicitly defined or provided for, for example at the current hierarchical level or at another hierarchical level or model location, the adaptation layer may provide services for the executable entity, as indicated at step 724 (FIG. 7C). In some implementations, the adaptation layer may provide services in coordination with the modeling environment 400. For example, the simulation engine 410 may include timing, delta time, and error handling services. The adaptation layer may coordinate the provision of such services to the executable entities that utilize those services. In some embodiments, the adaptation layer may translate the style of services that are either explicitly defined or implicitly generated to the style required by the executable entity, as indicated at step 726.

The data scheduling coordination engine 432 may determine a schedule for exchanging data between the parent model or parent model component and the model component and among the executable entities of the model component, where the schedule is coordinated with the schedule for executing the model component's executable entities, as indicated at step 728. The data scheduling coordination engine 432 may retrieve the latency scheme from the adaptation layer and evaluate it against the logic of the parent model or model component that invokes execution of the executable entities. The data scheduling coordination engine 432 may determine when input data needs to be provided to the model component, and when output data from the model component needs to be retrieved so that the data exchange is coordinated with the running of the executable entities and satisfies the specified latency scheme.

In some embodiments, data buffers may be established for the model component for storing input data used by the model component and output data produced by the model component. If a model component requested data transfers as a service, then the model component may not itself establish data buffers. Instead, the requested data transfer services may be provided at the current hierarchical level, as discussed.

The executable entities of a model component may use access methods to get input data from the buffers and to store output data in the buffers. The data scheduling coordination engine 432 may establish a schedule for the reading and writing to and from these buffers. The schedule may be synchronized to the execution schedule of the model component's executable entities, and may satisfy the latency scheme established for the model component's input and output data transfers. The scheduling of data transfers to and from a model component may also be a function of data dependencies among the model elements of a model component. A data transfer schedule may be provided to the adaptation layer, which may call the access methods according to the data transfer schedule, for example to provide requested data transfer services.

The data buffers may be allocated by the model compiler 416 during compilation if all of the data transfer information is available. If the model compiler 416 lacks sufficient information to allocate the data buffers during compilation, for example because the data transfer behavior is not yet known, allocation may be deferred, e.g., during an initialization phase. In some implementations, data buffer allocation may be performed during model execution. Furthermore, an adaptation layer may provide an interface to access data buffers.

The simulation engine 410 may execute the parent model or the parent model component that includes the model component, as indicated at step 730.

Model Execution

The simulation engine 410 may generate execution instructions for a model that invokes a model component using a different call style than the call style for which the model component was originally designed. The generation of execution instructions and the execution of a model may involve several phases, such as an initialization phase, a simulation (or run) phase, zero, one or more reset phases, and a termination phase. Model execution may involve receiving and processing input data and generating output data. In some embodiments, execution of a model may be carried out over a time span, e.g., a simulation time, which may be user specified or machine specified. Simulation time is a logical execution time, and may begin at a simulation start time and end at a simulation end time. At successive points between the simulation start and end times, which points in time may be called simulation time steps, states, inputs, and outputs of model elements of the model may be computed. The sizes of the time steps may be fixed or may vary, and may be determined by the particular solver 418 selected and used in the execution of the model. Execution instructions may be generated by the simulation engine 410 over the entire simulation time.

Initialization Phase

The initialization phase may mark the start of execution of a model, and may include compiling and linking of instructions. The initialization phase may involve preparing data structures and evaluating parameters, configuring and propagating block characteristics, determining block connectivity, and performing block reduction and block insertion. The preparation of data structures and the evaluation of parameters may result in the creation and initialization of one or more data structures for use in the initialization phase. For the blocks of the model, a method may force the blocks to evaluate all of their parameters, and this method may be called for each block in the model. If there are any unresolved parameters, execution and/or compilation errors may be thrown. During the configuration and propagation of block and port/signal characteristics, compiled attributes (such as data dimensions, data types, complexity, sample modes, and sample time) of each block and/or port/signal may be setup on the basis of the corresponding behaviors and the attributes of the blocks and/or port/signal that are connected to the given block and/or port/signal. The attribute setup may be performed through a process during which block behaviors "ripple through" the model from one block to the next following signal, dataflow, control, state, physical, message or other connectivity.

This process may be referred to as inferencing, an implementation of which is propagation. In the case of a block that has explicitly specified its block (or port) behaviors, propagation helps ensure that the attributes of the block (or port) are compatible with the attributes of the blocks (or ports) connected to it. If not, a warning or an error may be issued by the simulation engine 410, and presented to a user by the user interface engine 402. Many blocks (or ports) may be implemented to be compatible with a wide range of attributes. Such blocks (or ports) may adapt their behavior in accordance with the attributes of the blocks (or ports) connected to them. The exact implementation of the block may be chosen on the basis of the model in which the block is located. Included within this step may be other aspects such as validating that all rate-transitions yield deterministic results, and that the appropriate rate transition blocks and/or delay blocks are being used.

The initialization phase also may determine actual block connectivity. For example, virtual blocks may play no semantic role in the execution of a model. In this step, the virtual blocks may be optimized away, e.g., removed, and the remaining non-virtual blocks may be reconnected to each other appropriately. This compiled version of the model with actual block connections may be used from this point forward in the execution process. The way in which blocks are interconnected in the model does not necessarily define the order in which the block methods will be executed. In some embodiments, block methods may include output equations, derivative equations and update equations.

Block sample times may also be determined during the initialization phase. A block's sample time may be set explicitly, e.g., by setting a SampleTime parameter of the block, or it may be determined in an implicit manner based on the block's type or its context within the model. The SampleTime parameter may be a vector $[T_s, T_o]$ where $T_s$ is the sampling period and $T_o$ is the initial time offset. During initialization, the model compiler 416 may determine the sample times of model elements from their SampleTime parameter for model elements having explicit sample times, the model element type for model elements having implicit sample times, or by the model content for model elements that inherit their sample times. The compiled sample times determine the sample rates of the model elements during simulation.

The selected solver 418 may determine the size of the simulation time steps for the simulation of the model, and these simulation time steps may be selected to correspond with the sample times of the blocks of the model. When a simulation time step matches the sample time for a block, a sample time hit occurs, and the block is scheduled for execution during that simulation step.

The solvers 418a-c may include or access one or more schedulers that may generate execution lists for the blocks of the model. In particular, the schedulers may generate a block sorted order list and a method execution list. The schedulers may utilize one or more algorithms for generating the block sorted order and method execution lists. For example, a static scheduler may use the Rate Monotonic Scheduling (RMS), Earliest Deadline First Scheduling, Static Cyclic Scheduling, or Deadline Monotonic Scheduling. A dynamic scheduler may use an event calendar to schedule future events, such as timeouts and alarms.

In some implementations, the initialization phase may also include user-specified operations, which may be executed during the initialization phase. For example, operations specified in a subsystem that conditionally executes in response to an initialization event may be performed during the initialization phase.

The initialization phase may occur once.

Run Phase

The run or simulation phase may follow the initialization phase. During the run phase, the simulation engine 410 may enter a simulation loop or iteration loop stage during which the simulation engine 410 successively obtains inputs and computes the states and outputs of the model elements at particular simulation time steps from the simulation start time to the simulation end time. At each step, new values for the model elements' inputs, states, and outputs may be computed, and the model elements may be updated to reflect the computed values. The length of time between steps is called the step size. The step sizes depend on the type of solver 418 selected to execute the model, the model's fundamental sample time, and whether the model's continuous states have discontinuities, such as zero crossings. The steps of the simulation or iteration loop may be repeated until the simulation end time is reached. At the end of the simulation time, the model reflects the final values of the model element's inputs, states, and outputs. In some embodiments, a model may be executed without a preset simulation end time.

Reset Phase(s)

In some embodiments, the run phase may include zero, one, or more reset phases. A reset phase may include an implicit portion during which system-generated operations may be executed. A reset phase also may include an explicit portion during which user specified (explicit) reset operations may be executed. For example, user specified operations may be specified in a subsystem that conditionally executes in response to a reset event. In some implementations, a reset phase may only include explicit reset operations.

During the run phase, code may or may not be generated for the model. If code is generated, the model may be executed through an accelerated execution mode in which the model, or portions of it, is translated into either software modules or hardware descriptions. If this stage is performed, then the stages that follow may use the generated code during the execution of the model. If code is not generated, the model may execute in an interpretive mode in which the compiled and linked version of the model may be directly utilized by the simulation engine 410 to execute the model over the simulation time. A model need not necessarily be executed when code is generated for the model. Instead of executing the model within the modeling environment 400, the generated code 434 may be compiled and deployed on a target device, such as a controller, test hardware, etc.

Termination Phase

The termination phase may follow the run phase. During the termination phase, the simulation engine 410 may perform clean-up operations. For example, the simulation engine 410 may release allocated memory. Other operations that may be performed during a termination phase include saving internal memory to persistent memory, such as a Non-Volatile Random Access Memory (NVRAM), turning off ADCs and DACs, shutting down an actuator, issuing a finish flag, and writing data out to data files and closing the data files.

The termination phase may also include user-specified (explicit) termination operations that may be executed during the termination phase. For example, user-specified operations may be included in a subsystem that conditionally executes in response to a termination event. The termination phase may occur once.

It should be understood that a model may include additional and/or other phases besides initialization, run, reset, and termination. For example, a model may include a warm start phase, a cold start phase, a partial reset phase, a soft reset phase, a full reset phase, a hard reset phase, a normal terminate phase, and an emergency terminate phase, among others. Different operations may be performed during different initialize, reset, or terminate phases. For example, during an emergency termination phase, the only operation that may be performed is to save critical data, e.g., before losing power.

The code generator 406 may generate code for the parent model or the parent model component that includes the model component, as indicated at step 732. The generated code may implement a schedule for invoking the executable entities of the model component based on the user-specified functionality linked to the model component's adaptation layer. The generated code may include code that coordinates the calling of the executable entities of the model component with the exchange of data between the model and the model component. The generated code also may include code for the bindings of the different call styles used in the parent model or parent model component and in the model component.

Code generation also may include generating code to call services provided by the environment in which the code is to be run. In the simulation environment, e.g., the modeling environment, these services may be provided by the simulation engine 410. Examples of such services include data transfer, timers, elapsed time, and error handling. For deployment in a real-time environment, for example, these services may be provided by a real-time operating system (RTOS) and/or by one or more hardware elements of the real-time environment, such as a hardware clock.

Figure 9:
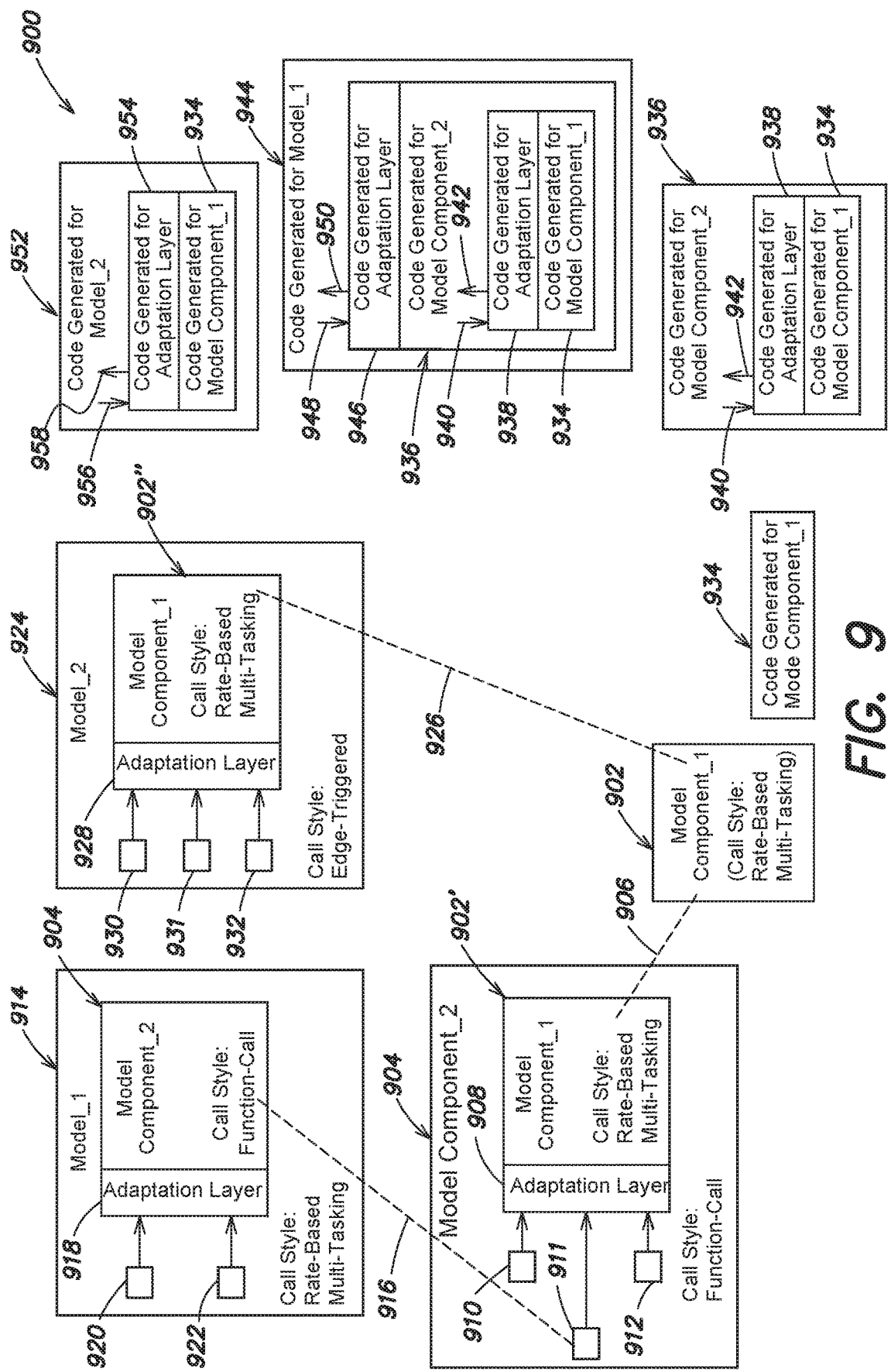
FIG. 9 is a schematic illustration of an example reuse environment in accordance with an embodiment.

FIG. 9 is a schematic illustration of an example reuse environment 900 in accordance with an embodiment. The reuse environment 900 may include a model component 902, which may be a graphical model component, such as a subsystem or a sub-model, created by a user operating the modeling environment 400. The model component 902 may have been originally created to utilize a rate-based, multi-tasking call style. The model component 902 may be subjected to verification testing, and proven to satisfy verification requirements for the model component 902. The model component 902 may be saved in a library used by the modeling environment 400.

An instance of the model component 902, indicated by reference number 902', may be included within a model component 904 (Model Component_2) as indicated by dashed arrow 906. The instance 902' may be a copy of the model component 902. Alternatively, the instance 902' may represent a link, such as a library link, to the model component 902, which may be saved in the library. Changes to the linked model component 902 saved in the library may be inherited by all instances of the model component through the library link, such as the instance 902'. The structure and operation of the model component 902, as saved in the library, may be fully defined and fixed, and every instance of the component 902 may implement that fixed structure and operation.

The model component 904 also may be a graphical model component created by a user in the modeling environment 400. The model component 904, however, may have been created to utilize a function-call call style. To utilize the rate-based, multi-tasking based model component instance 902' in the function-call based model component 904, the model adaptor 412 may construct an adaptation layer interface 908 for the model component instance 902'. In addition, the model component 904 may include functionality or logic, illustrated by model elements 910-912, connected to the adaptation layer interface 908 to invoke the executable entities of the model component instance 902'. The adaptation layer may bind the function-call based calls of the model component 904 to the rate-based, multi-tasking call style of the model component instance 902'. Significantly, the model component instance 902' need not be modified to be run within the model component 904. For example, no model elements of the model component instance 902' need to be added, removed, replaced, or changed for the rate-based, multi-tasking model component instance 902' to be run in the function-call model component 904. Because no changes have to be made to the model component instance 902', there may be no requirement to re-verify the model component instance 902'.

The model component 904 may be included in a model 914 (Model_1) as indicated by dashed arrow 916. The model 914 may be a graphical model created by a user in the modeling environment 400. The model 914 may be created to utilize a rate-based, multi-tasking call style. To utilize the function-call based model component 904 in the model 914, the model adaptor 412 may construct an adaptation layer interface 918 for the model component 904. In addition, the model 914 may include logic, illustrated by model elements 920 and 922, connected to the adaptation layer interface 918 to invoke the executable entities of the model component 904, which in turn, invoke the executable entities of the model component instance 902'.

Another instance of the model component 902, indicated by reference number 902", may be included in another model 924 (Model_2), as indicated by dashed arrow 926. The model 924 may be a graphical model created by a user in the modeling environment 400. The model 924, however, may have been created to utilize an edge-triggered call style. To utilize the rate-based, multi-tasking based model component instance 902" in the edge-triggered based model 924, the model adaptor 412 may construct an adaptation layer and adaptation layer interface 928 for the model component instance 902". In some embodiments, the previously created adaptation layer may be used for the model component instance 902". In addition, the model 924 may include logic, illustrated by model elements 930-932, connected to the adaptation layer interface 928 to invoke the executable entities of the model component instance 902". The adaptation layer may bind the edge-triggered calls of the model 924 to the rate-based, multi-tasking call style of the model component instance 902". Again, the model component instance 902" need not be modified to be run within the model 924. Accordingly, there may be no need to re-verify the model component instance 902".

FIG. 9 also illustrates the re-use of code generated for the model component 902. For example, the code generator 406 may generate code 934 for the model component 902. The code generator 406 also may generate code 936 for the model component 904 that includes the model component instance 902'. Instead of generating new code for the model component instance 902', as included in the model component 904, the code generator 406 may re-use the generated code 934 for the model component 902 within the generated code 936 for the model component 904. The code generator 406 may generate code 938 for the adaptation layer and include this code 938 in the code 936 for the model component 904. The code generator 406 also may generate code for calls and returns to the code 938 generated for the adaptation layer, as indicated by arrows 940 and 942.

The code generator 406 may generate code 944 for the model 914. Instead of generating new code for the model component 904 that is included in the model 914, the code generator 406 may reuse the code 936 generated for the model component 904, including the code 934 generated for the model component instance 902'. The code generator 406 may generate code 946 for the adaptation layer to the model component 904. The code generator 406 also may generate code for calls and returns to the code 946 generated for the adaptation layer, as indicated by arrows 948 and 950.

The code generator 406 may generate code 952 for the model 924, which includes the model component instance 902". Instead of generating new code for the model component instance 902", the code generator 406 may re-use the generated code 934 for the model component 902. The code generator 406 may generate code 954 for the adaptation layer created for the model component instance 902". The code generator 406 also may generate code for calls and returns to the code 954 generated for the adaptation layer, as indicated by arrows 956 and 958.

The partitioning of a model component into executable entities may be guided by user input. For example, one or more settings may be available for controlling the partitioning of a model component. The one or more settings may be user-settable. For example, a setting may determine whether separate partitions should be created for executable entities that execute at the same sample rate or in response to the same function call.

Figure 10:
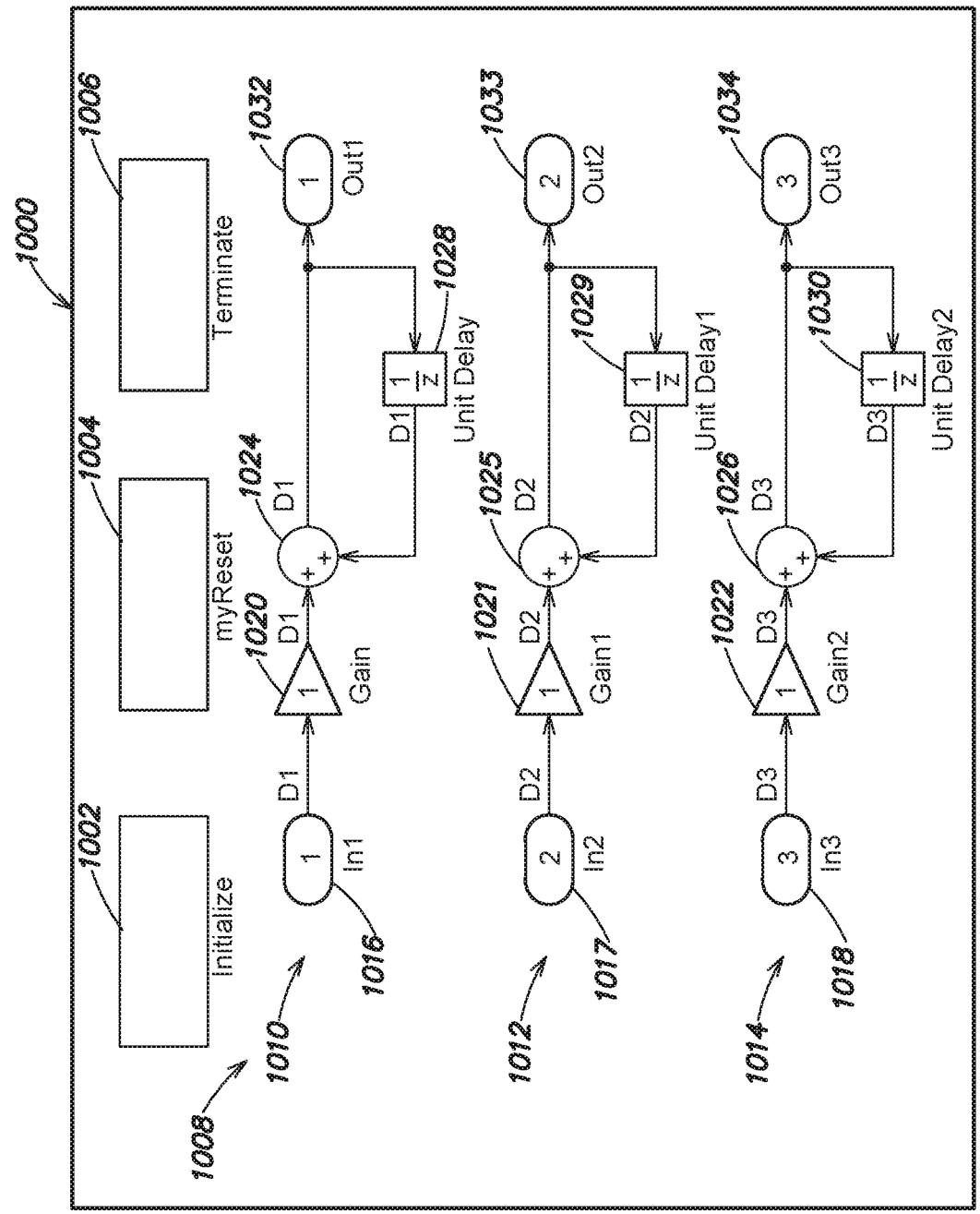
FIG. 10 is a schematic illustration of an example model component in accordance with an embodiment.

FIG. 10 is a schematic illustration of an example model component 1000. The model component 1000 may include an initialize subsystem 1002, a reset subsystem 1004 (labeled 'myReset'), a terminate subsystem 1006, and an algorithmic model portion 1008. The algorithmic model portion 1008 may include a plurality of interconnected model elements. The algorithmic model portion 1008 may include three separate, e.g., unconnected, pathways 1010, 1012, and 1014. The pathways 1010, 1012, and 1014 may each include an Inport block 1016-1018, a Gain block 1020-1022, a Sum block 1024-1026, a Unit Delay block 1028-1030, and an Outport block 1032-1034.

The algorithmic model portion 1008 may represent a multirate, dynamic system, and may be implemented using a rate-based multitasking modeling style. In particular, the pathways 1010, 1012, and 1014 may execute at different rates. For example, the pathways 1010 and 1014 may execute at a periodic rate of 1 second, while the pathway 1012 may execute at a periodic rate of 2 seconds.

The initialize subsystem 1002, the myReset subsystem 1004, and the terminate subsystem 1006 may be event-triggered subsystems that listen for events, such as an initialize event, a reset event, and a termination event, respectively. The subsystems 1002, 1004, and 1006 may include user-specified functionality, e.g., explicit operations, that execute in response to the occurrence of the respective event.

The partitioning engine 422 may analyze the model component 1000, and identify the different executable entities that form the model component 1000. In some embodiments, the partitioning engine 422 may consider the pathways 1010 and 1014 to be part of a single partition because they both run at the same periodic rate, e.g., 1 second. A user, however, may wish to explicitly schedule the execution of the two the pathways 1010 and 1014 separately, e.g., independently of each other. Accordingly, the user may guide the partitioning engine 422 to identify the pathways 1010 and 1014 as separate partitions.

Figure 11:
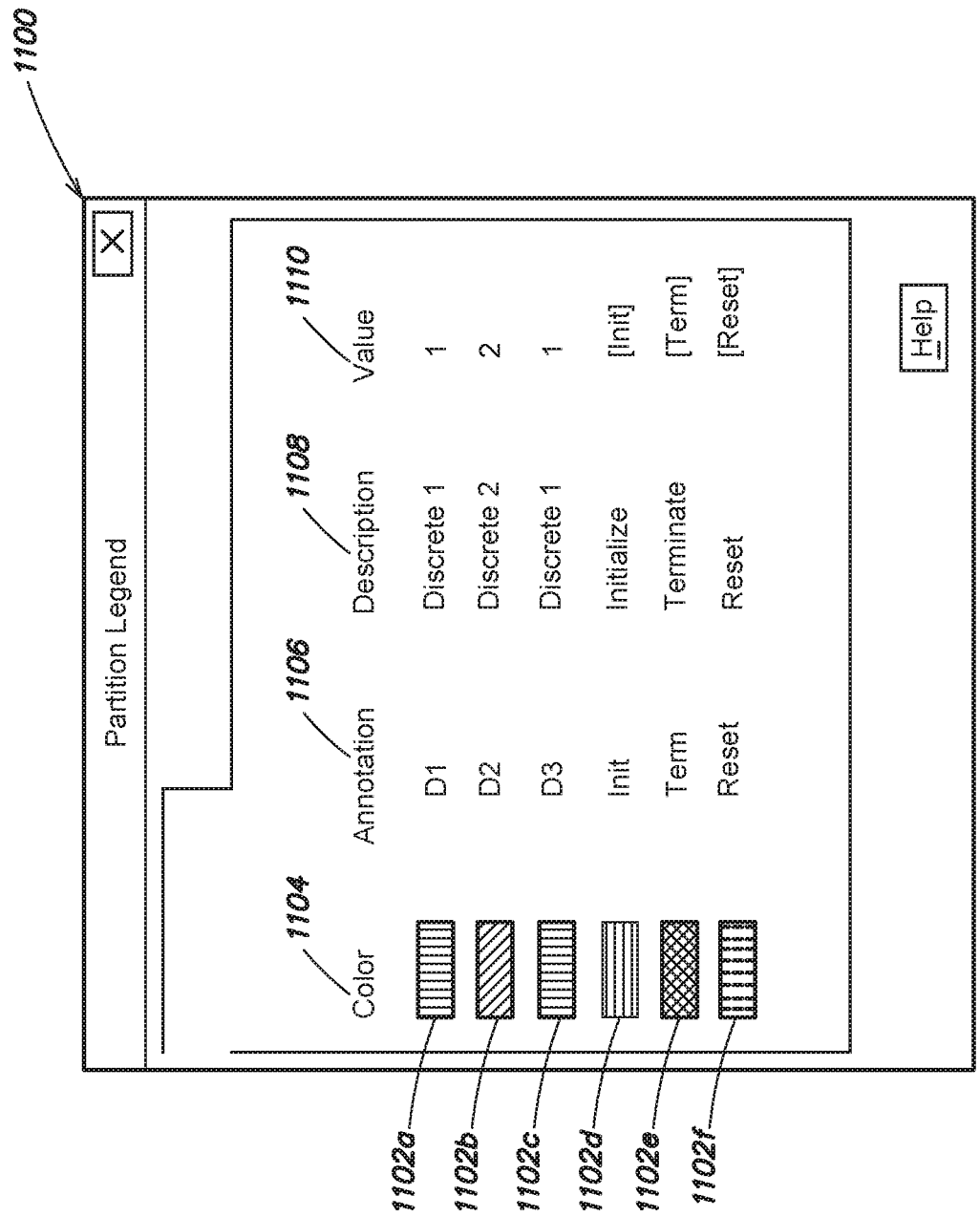
FIG. 11 is a schematic illustration of an example user interface window in accordance with an embodiment.

FIG. 11 is a schematic illustration of an example window, which may be in the form of a partition legend dialog 1100, for the model component 1000 of FIG. 10 in accordance with an embodiment. The partition legend dialog 1100 may include a plurality of rows 1102a-f where each row may correspond to an executable entity identified by the partitioning engine 422. The partition legend dialog 1100 also may include a color column 1104, an annotation column 1106, a description column 1108, and a value column 1110. The partitions may be represented on the model component 1000 using color-coding and annotations. The particular colors and annotations used on the model component 1000 for the different execution partitions may be included in the color column 1104 and the annotation column 1106 of the partition legend dialog 1100. The description column 1108 may include information identifying the call style of the executable entity, and the value column 1110 may indicate a value for the call style of the execution entity.

For example, row 1102a indicates that the pathway 1010 is colored red and annotated with the label 'D1', and the call style is a discrete sample time whose value is 1 second. Row 1102b indicates that the pathway 1012 is colored green and annotated with the label 'D2', and the call style is discrete sample time whose value is 2 seconds. Row 1102c indicates that the pathway 1014 is also colored red and annotated with the label 'D3', and the call style is a discrete sample time whose value is 1 second, like the pathway 1010. Row 1102d indicates that the initialize subsystem 1002 is colored blue and annotated with the label 'Init' (if the initialize subsystem 1002 were opened), the call style is triggered, and the value of the trigger is [Init]. Row 1102e indicates that the terminate subsystem 1006 is colored orange and annotated with the label 'Term' (if the terminate subsystem 1006 were opened), the call style is triggered, and the value of the trigger is [Term]. Row 1102f indicates that the myReset subsystem 1004 is colored purple and annotated with the label 'Reset' (if the myReset subsystem 1004 were opened), the call style is triggered, and the value of the trigger is [Reset].

Figure 12:
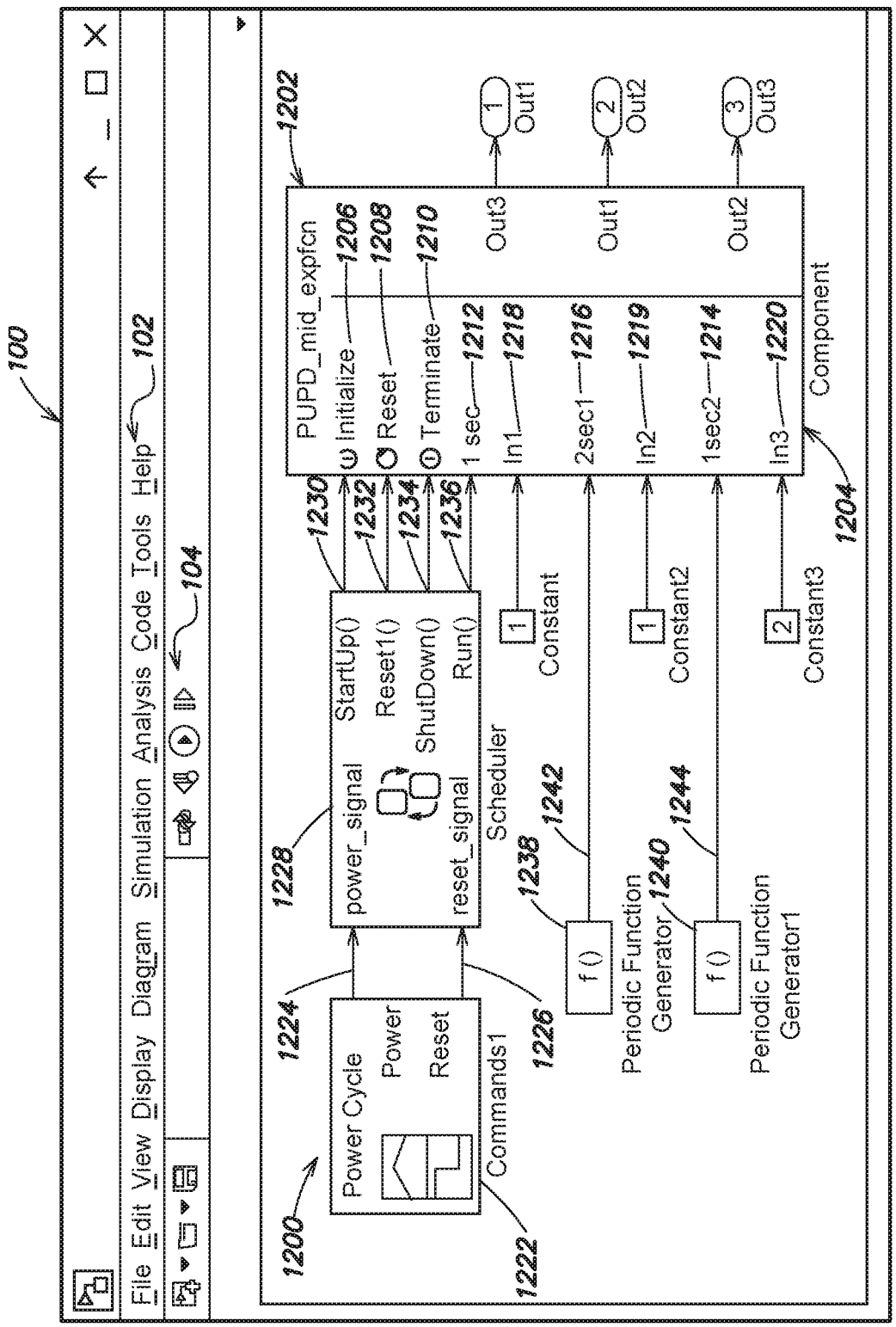
FIG. 12 is a schematic illustration of an example model that includes the example model component of FIG. 10 in accordance with an embodiment.

FIG. 12 is a schematic illustration of an example model 1200 that may be opened in the model editor window 100 in accordance with an embodiment. The model 1200 includes the model component 1000, which is represented in the model 1200 by a model reference block 1202. The model reference block 1202 may include an adaptation layer interface 1204, which includes access points corresponding to the entry points determined for the model component 1000. For example, the adaptation layer interface 1204 includes an initialize access point 1206, a Reset access point 1208, a Terminate access point 1210, two 1_second access points 1212 (labeled ' 1 sec') and 1214 (labeled ' 1 sec2'), a 2 second access point 1216 (labeled '2 sec1'), and three data input access points 1218-1220. The 1_second access point 1212 may correspond to the pathway 1010 of the model component 1000, while the 1_second access point 1214 may correspond to the pathway 1014 of the model component 1000.

The model 1200 may implement a function-call-based modeling style. For example, the model 1200 may include model elements that issue function calls, and at least some of these model elements may be used to schedule the execution of the execution entities of the model component 1000 explicitly. For example, the model 1200 may include a Signal Builder block 1222 that, during execution of the model 1200, sources a Power signal 1224 and a Reset signal 1226, and a state chart (labeled 'Scheduler') 1228 that receives the Power signal 1224 and the Reset signal 1226 from the Signal Builder block 1222. The Scheduler state chart 1228 may issue a StartUp( ) function call 1230, a Reset( ) function call 1232, a ShutDown( ) function call 1234, and a Run( ) function call 1236. The model 1200 also may include two function generator blocks 1238 and 1240, which may issue a Run1( ) function call 1242 and a Run2( ) function call 1244.

The StartUp( ) function call 1230 may be connected to the initialize access point 1206 of the adaptation layer interface 1204. In response, the mapping engine 426 may bind the StartUp( ) function call 1230 to the initialize event. The Reset( ) function call 1232 may be connected to the Reset access point 1208 of the adaptation layer interface 1204. In response, the mapping engine 426 may bind the Reset( ) function call 1232 to the reset event. The ShutDown( ) function call 1234 may be connected to the terminate access point 1210 of the adaptation layer interface 1204. In response, the mapping engine 426 may bind the ShutDown( ) function call 1236 to the terminate event. The Run( ) function call 1236 of the Scheduler state chart 1228 may be connected to the 1 sec access point 1212 of the adaptation layer interface 1204. In response, the mapping engine 426 may bind the Run( ) function call 1236 to the 1 second discrete sample time of the pathway 1010 of the algorithmic model portion 1008.

The Run1( ) function call 1242 of the function generator block 1238 may be connected to the 2 sec1 access point 1216 of the adaptation layer interface 1204. In response, the mapping engine 426 may bind the Run1( ) function call 1242 to the 2 seconds discrete sample time of the pathway 1012 of the algorithmic model portion 1008. The Run2( ) function call 1244 of the function generator block 1240 may be connected to the 1 sec2 access point 1214 of the adaptation layer interface 1204. In response, the mapping engine 426 may bind the Run2( ) function call 1244 to the 1 second discrete sample time of the pathway 1014 of the algorithmic model portion 1008.

By providing separate access points for the two pathways 1010 and 1014 of the model component 1000, even though they both are run at the same rate, a user can utilize different logic, e.g., the Signal Builder block 1222 and the Scheduler state chart 1228 in one instance, and the function generator block 1240 in a second instance, for generating function calls for scheduling execution of the executable entities corresponding to the two pathways 1010 and 1014.

As described, the partitioning engine 422 may support both automatic, e.g., implicit, partitioning and user directed, e.g., explicit, partitioning. An entry point may be established for each partition, and both implicit and explicit partitions may be represented in the interface through access points.

In some embodiments, user-specified logic or functionality connected to an adaptation layer interface may be saved, for example as a template in a library. Referring to FIG. 3, the Signal Builder block 316 (Commands 1), the state chart 322 (Scheduler), and the function generator block 332 (Periodic Function Generator) represent user-specified scheduling logic for scheduling the partitioned executable entities of the model component 302. This scheduling logic, which implements a desired execution schedule, may be saved as a template, and re-used with other model components. For example, an instance of the saved scheduling logic template may be included in another model, and used to run a different model component. The different model component may include an adaptation layer interface that includes an initialize access point, a reset access point, a Terminate access point, a 1 s_Run access point, and a 2 s_Run access point, like the initialize access point 306, the myReset access point 308, the Terminate access point 310, the 1 s_Run access point 312, and the 2 s_Run access point 314 of the adaptation layer interface 304 of the model component 302.

In addition, scheduling logic defined at multiple levels of a model hierarchy may be aggregated. The aggregated scheduling logic may be saved as a template. For example the aggregated scheduling logic may be saved in a library. The aggregated scheduling logic may be reused, for example in another model and/or in other portions of the same model. In some embodiments, values for scheduling parameters and attributes may be specified for a given model, and these values also may be saved in the library, e.g., with the scheduling logic. For example, a user may set an attribute of an Initialize component, such that the Initialize component is to be aggregated in a particular manner, for example at all hierarchical levels but a top level, or in a subhierarchy of an enable subsystem, etc. The value of this attributed may be saved and reused in, e.g., adopted by, one or more other models.

Figure 13:
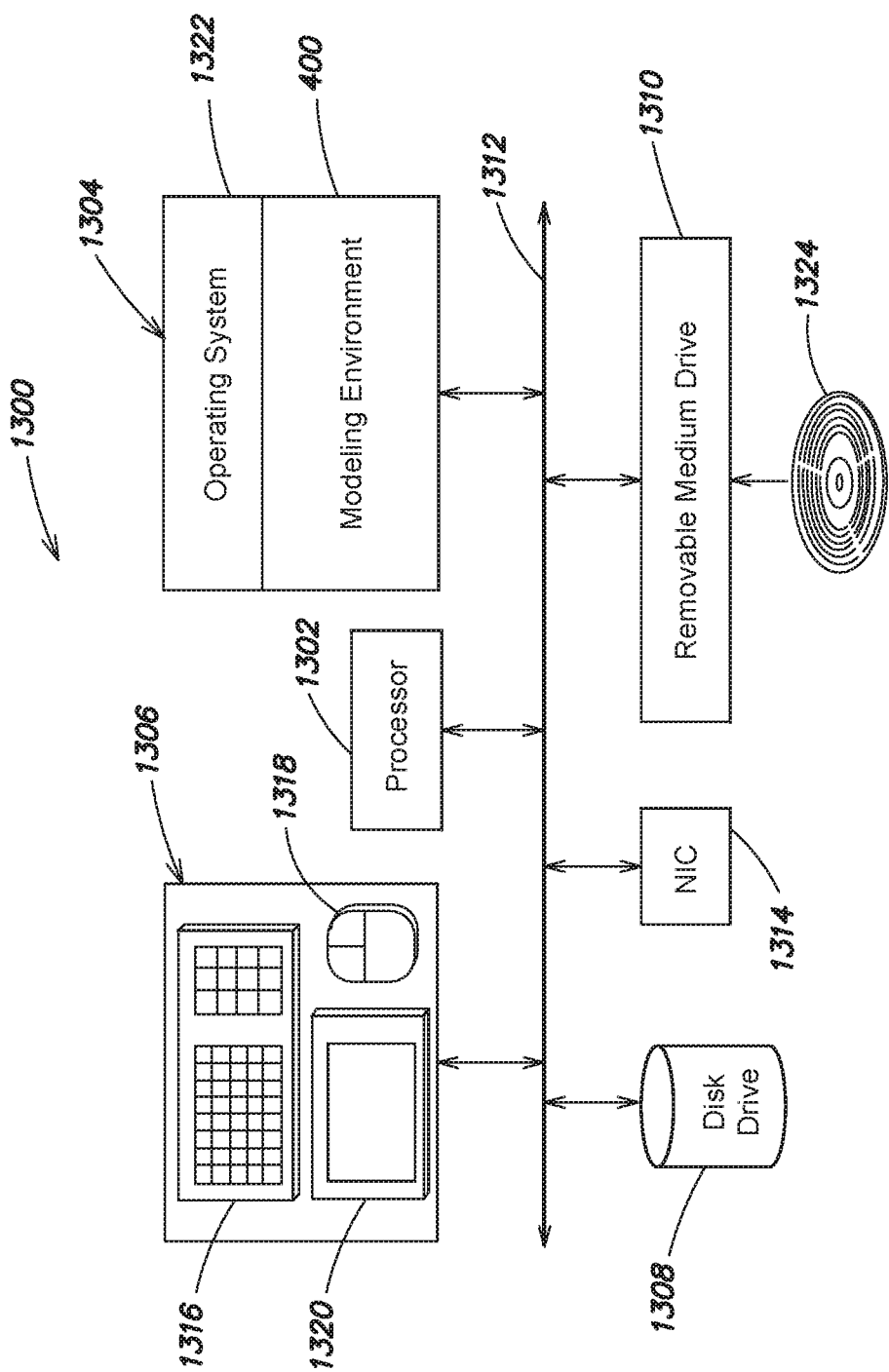
FIG. 13 is a schematic illustration of an example computer or data processing system in accordance with an embodiment.

FIG. 13 is a schematic illustration of an example computer or data processing system 1300 for implementing an embodiment of the invention. The computer system 1300 may include one or more processing elements, such as a processor 1302, a main memory 1304, user input/output (I/O) 1306, a persistent data storage unit, such as a disk drive 1308, and a removable medium drive 1310 that are interconnected by a system bus 1312. The computer system 1300 may also include a communication unit, such as a network interface card (NIC) 1314. The user I/O 1306 may include a keyboard 1316, a pointing device, such as a mouse 1318, and a display 1320. Other user I/O 1306 components include voice or speech command systems, touchpads and touchscreens, printers, projectors, etc. Exemplary processors include single or multi-core Central Processing Units (CPUs), Graphics Processing Units (GPUs), Field Programmable Gate Arrays (FPGAs), Application Specific Integrated Circuits (ASICs), microprocessors, microcontrollers, etc.

The main memory 1304, which may be a Random Access Memory (RAM), may store a plurality of program libraries or modules, such as an operating system 1322, and one or more application programs that interface to the operating system 1322, such as the modeling environment 1300.

The removable medium drive 1310 may accept and read a computer readable medium 1326, such as a CD, DVD, floppy disk, solid state drive, tape, flash memory or other non-transitory medium. The removable medium drive 1310 may also write to the computer readable medium 1324.

Suitable computer systems include personal computers (PCs), workstations, servers, laptops, tablets, palm computers, smart phones, electronic readers, and other portable computing devices, etc. Nonetheless, those skilled in the art will understand that the computer system 1300 of FIG. 13 is intended for illustrative purposes only, and that the present invention may be used with other computer, data processing, or computational systems or devices. The present invention may also be used in a computer network, e.g., client-server, architecture, or a public and/or private cloud computing arrangement. For example, the modeling environment 1300 may be hosted on one or more cloud servers or devices, and accessed by remote clients through a web portal or an application hosting system, such as the Remote Desktop Connection tool from Microsoft Corp.

Suitable operating systems 1322 include the Windows series of operating systems from Microsoft Corp. of Redmond, Wash., the Android and Chrome OS operating systems from Google Inc. of Mountain View, Calif., the Linux operating system, the MAC OS® series of operating systems from Apple Inc. of Cupertino, Calif., and the UNIX® series of operating systems, among others. The operating system 1322 may provide services or functions for applications or modules, such as allocating memory, organizing data objects or files according to a file system, prioritizing requests, managing I/O, etc. The operating system 1322 may run on a virtual machine, which may be provided by the data processing system 1300.

As indicated above, a user, such as an engineer, scientist, programmer, developer, etc., may utilize one or more input devices, such as the keyboard 1316, the mouse 1318, and the display 1320 to operate the modeling environment 1300, and construct and revise one or more models. As discussed, the models may be computational and may have executable semantics. In particular, the models may be simulated or run. In particular, the models may provide one or more of time-based, event-based, state-based, message-based, frequency-based, control-flow based, and dataflow-based execution semantics. The execution of a model may simulate operation of the system that is being designed or evaluated. The term graphical model is intended to include graphical program.

Exemplary modeling environments include the MATLAB® algorithm development environment and the Simulink® model-based design environment from The MathWorks, Inc., as well as the Simscape™ physical modeling system and the Stateflow® state chart tool also from The MathWorks, Inc., the MapleSim physical modeling and simulation tool from Waterloo Maple Inc. of Waterloo, Ontario, Canada, the LabVIEW virtual instrument programming system and the NI MatrixX model-based design product both from National Instruments Corp. of Austin, Tex., the Visual Engineering Environment (VEE) product from Agilent Technologies, Inc. of Santa Clara, Calif., the System Studio model-based signal processing algorithm design and analysis tool and the SPW signal processing algorithm tool from Synopsys, Inc. of Mountain View, Calif., a Unified Modeling Language (UML) system, a Systems Modeling Language (SysML) system, the System Generator system from Xilinx, Inc. of San Jose, Calif., and the Rational Rhapsody Design Manager software from IBM Corp. of Somers, N.Y. Models created in the high-level modeling environment may contain less implementation detail, and thus operate at a higher level than certain programming languages, such as the C, C++, C#, and SystemC programming languages.

Those skilled in the art will understand that the MATLAB® algorithm development environment is a math-oriented, textual programming environment for digital signal processing (DSP) design, among other uses. The Simulink® model-based design environment is a modeling tool for modeling and simulating dynamic and other systems, among other uses. The MATLAB® and Simulink® environments provide a number of high-level features that facilitate algorithm development and exploration, and support model-based design. Exemplary high-level features include dynamic typing, array-based operations, data type inferencing, sample time inferencing, and execution order inferencing, among others.

In some embodiments, a lower level programming language relative to the high-level modeling environment 400, such as the C, C++, C#, and SystemC programming languages, among others, may be used to create one or more models.

Models constructed within the modeling environment 400 may include textual models, graphical models, such as block diagrams, state-based models, and combinations thereof. A given model may simulate, e.g., approximate the operation of, a system.

Exemplary code generators include, but are not limited to, the Simulink® Coder™, the Embedded Coder®, and the HDL Coder™ products from The MathWorks, Inc. of Natick, Mass., and the TargetLink product from dSpace GmbH of Paderborn Germany.

Figure 14:
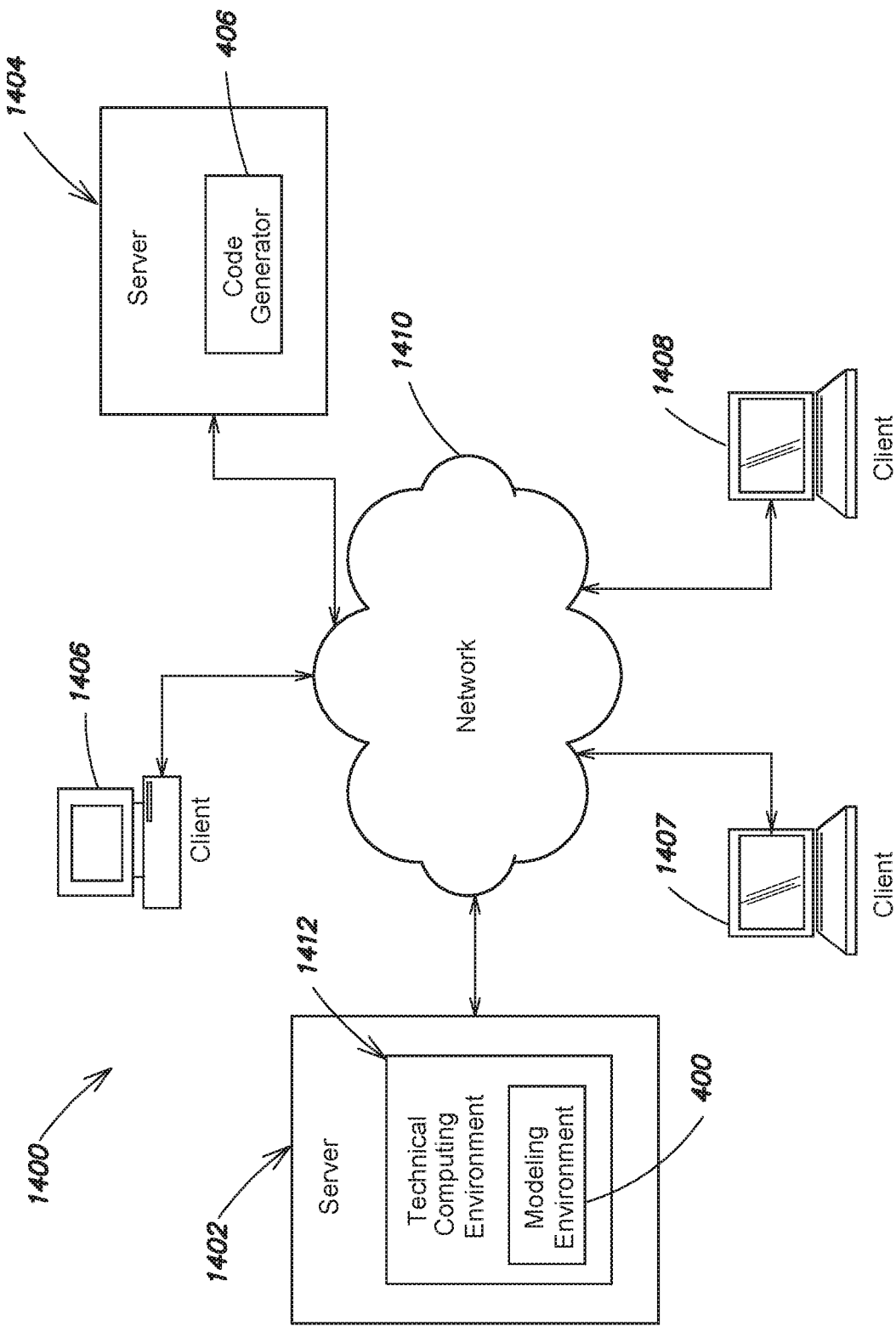
FIG. 14 is a schematic diagram of an example distributed computing environment in accordance with an embodiment.

FIG. 14 is a schematic diagram of an example distributed computing environment 1400 in which systems and/or methods described herein may be implemented. The environment 1400 may include client and server devices, such as two servers 1402 and 1404, and three clients 1406-1408, interconnected by one or more networks, such as network 1410. The servers 1402 and 1404 may include applications or processes accessible by the clients 1406-1408. For example, the server 1402 may include a technical computing environment (TCE) 1412, which may include or have access to a modeling environment, such as the modeling environment 1300. The server 1404 may include a code generator, such as the code generator 1306. The devices of the environment 1400 may interconnect via wired connections, wireless connections, or a combination of wired and wireless connections.

The servers 1402 and 1404 may include one or more devices capable of receiving, generating, storing, processing, executing, and/or providing information. For example, the servers 1402 and 1404 may include a computing device, such as a server, a desktop computer, a laptop computer, a tablet computer, a handheld computer, or a similar device. In some implementations, the servers 1402 and 1404 may host the TCE 1412, the modeling environment 1300, and/or the code generator 1306.

The clients 1406-1408 may be capable of receiving, generating, storing, processing, executing, and/or providing information. Information may include any type of machine-readable information having substantially any format that may be adapted for use, e.g., in one or more networks and/or with one or more devices. The information may include digital information and/or analog information. The information may further be packetized and/or non-packetized. In an embodiment, the clients 1406-1408 may download data and/or code from the servers 1402 and 1404 via the network 1410. In some implementations, the clients 1406-1408 may be desktop computers, workstations, laptop computers, tablet computers, handheld computers, mobile phones (e.g., smart phones, radiotelephones, etc.), electronic readers, or similar devices. In some implementations, the clients 1406-1408 may receive information from and/or transmit information to the servers 1402 and 1404.

The network 1410 may include one or more wired and/or wireless networks. For example, the network 1410 may include a cellular network, a public land mobile network ("PLMN"), a local area network ("LAN"), a wide area network ("WAN"), a metropolitan area network ("MAN"), a telephone network (e.g., the Public Switched Telephone Network ("PSTN")), an ad hoc network, an intranet, the Internet, a fiber optic-based network, and/or a combination of these or other types of networks. Information may be exchanged between network devices using any network protocol, such as, but not limited to, the Internet Protocol (IP), Asynchronous Transfer Mode (ATM), Synchronous Optical Network (SONET), the User Datagram Protocol (UDP), Institute of Electrical and Electronics Engineers (IEEE) 802.11, etc.

The number of devices and/or networks shown in FIG. 14 is provided as an example. In practice, there may be additional devices and/or networks, fewer devices and/or networks, different devices and/or networks, or differently arranged devices and/or networks than those shown in FIG. 14. Furthermore, two or more devices shown in FIG. 14 may be implemented within a single device, or a single device shown in FIG. 14 may be implemented as multiple, distributed devices. Additionally, one or more of the devices of the distributed computing environment 1400 may perform one or more functions described as being performed by another one or more devices of the environment 1400.

The following examples implement one or more aspects of methods and/or systems of the present disclosure. These examples are non-limiting examples. Features of different examples may be combined in other implementations. Features of each example may be modified or removed in other implementations.

Systems or methods comprise, for a model comprising model elements and links between the model elements, where at least some of the model elements and the links are defined by a declarative language, behaviors of the at least some of the model elements and the links comprise computational implementations implicitly defined by the declarative language, and the model is in a first presentation form, analyzing, by one or more processors, the model and the computational implementations, automatically determining based on the analyzing, by the one or more processors, adjustable attributes of the model that can be adjusted without changing a structure of the computational implementations, the adjustable attributes being implicitly defined by the declarative language or being explicitly defined by the model elements or the links, and extracting, by the one or more processors, at least one of the adjustable attributes for presenting with the model in a second presentation form different from the first presentation form, where the at least one of the adjustable attributes are to be presented explicitly at a user interface to allow adjusting the at least one of the adjustable attributes.

Systems and methods comprise, for a model comprising model elements and links between the model elements, where at least some of the model elements and the links are defined by a declarative language, behaviors of the at least some of the model elements and the links comprise computational implementations implicitly defined by the declarative language, and the model is in a first presentation form, analyzing, by one or more processors, the model and the computational implementations, automatically determining based on the analyzing, by the one or more processors, adjustable attributes of the model that can be adjusted without changing a structure of the computational implementations, the adjustable attributes having predefined features based on which the model can be executed, and extracting, by the one or more processors, at least one of the adjustable attributes for presenting with the model in a second presentation form different from the first presentation form, where the at least one of the adjustable attributes has a corresponding predefined feature, and is to be presented explicitly at a user interface to allow adjusting the at least one of the adjustable attributes to have a feature different from the corresponding predefined feature.

In some implementations, the adjustable attributes comprise one or more interfaces of one or more partitioned runnable entities within the model, each runnable entity comprises one or more model elements and/or links.

In some implementations, analyzing the model and the computational implementations comprises partitioning the model to determine the one or more partitioned runnable entities.

In some implementations, the one or more interfaces can be adjusted to be triggered through one or more explicit events or one or more implicit events.

In some implementations, the one or more explicit events are function calls or messages, and the one or more implicit events are trigger signals or periodic timers.

In some implementations, a first partitioned runnable entity is at a first level of hierarchy within the model and a second partitioned runnable entity is at a second, different level of hierarchy within the model, and a first interface of the first partitioned runnable entity and a second interface of the second partitioned runnable entity can be adjusted to be triggered by the same mechanism or different mechanisms.

In some implementations, the adjustable attributes comprise one or more execution rates of one or more model elements.

In some implementations, the systems or methods comprise presenting the at least one of the adjustable attributes within the model in the second representation form.

In some implementations, the model is executable in the first and the second representation forms.

In some implementations, the systems or methods comprise generating code for the model, wherein the code comprises a section that corresponds to the extracted, at least one of the adjustable attributes.

Systems and methods comprise accessing from a memory a model component, the model component including a plurality of executable entities, partitioning the plurality of executable entities of the model component, identifying adjustable attributes of the plurality of executable entities, establishing, for the model component, an adaptation layer that includes the adjustable attributes of the plurality of executable entities, exposing the adjustable attributes in a graphical affordance associated with the model component, binding logic linked to the adjustable attributes exposed in the graphical affordance associated with the model component, and at least one of utilizing the logic linked to the adjustable attributes during execution of the model component, or generating code for the model component, where the generated code includes one or more code sections implementing the logic linked to the adjustable attributes.

In some implementations, the systems and methods further comprise determining a calling schedule for the plurality of executable entities of the model component, the calling schedule indicated by at least a portion of the logic linked to the adjustable attributes.

In some implementations, the systems and methods further comprise coordinating the calling schedule with an exchange of data with the model component.

In some implementations, the logic linked to the adjustable attributes is user-specified.

In some implementations, the plurality of executable entities of the model component are invoked using a first call style, and the user-specified logic implements a second call style that differs from the first call style, the binding including mapping the second call style to the first call style.

In some implementations, the first call style is one of rate-based, event-based, function-call, or triggered.

In some implementations, the user-specified logic is included in a parent model that includes the model component, and the user-specified logic is graphically connected to access points associated with the exposed adjustable attributes included in the graphical affordance.

In some implementations, the systems and methods further comprise coordinating exchange of data between the parent model and the model component.

In some implementations, the model component is included in a model having hierarchical levels and the model component is included in a higher level model component, the systems and methods further comprise aggregating a given adjustable attribute of the model component with an adjustable attribute for the higher level model component that includes the model component.

In some implementations, the user-specified logic is implemented through a plurality of model elements.

Systems and methods comprise, for a model comprising model elements and links between the model elements, where at least some of the model elements and the links are defined by a declarative language, behaviors of the at least some of the model elements and the links comprise computational implementations implicitly defined by the declarative language, adjustable attributes of the model are extracted for adjusting without changing a structure of the computational implementations, the adjustable attributes having predefined features based on which the model can be executed, and at least one of the adjustable attributes has a corresponding predefined feature, and is adjustable to have a feature different from the corresponding predefined feature, generating code for the model, the code comprises one or more code sections corresponding to the adjustable attributes and other code sections corresponding to the computational implementations, wherein adjustment of the adjustable attributes lead to adjustment of the one or more code sections without affecting the other code sections.

Systems and methods comprise, for a model component including a plurality of executable entities, where the plurality of executable entities of the model component are partitioned; access points of the plurality of executable entities are identified; an adaptation layer that includes the access points of the plurality of executable entities is established; and selectable logic is linked to the adjustable attributes, generating, by at least one processor, code for the model, the code including one or more code sections implementing the selectable logic that implements an access method to at least one of the access point of an executable entity of the model component.

The foregoing description of embodiments is intended to provide illustration and description, but is not intended to be exhaustive or to limit the disclosure to the precise form disclosed. Modifications and variations are possible in light of the above teachings or may be acquired from a practice of the disclosure. For example, while a series of acts has been described above with respect to the flow diagrams, the order of the acts may be modified in other implementations. In addition, the acts, operations, and steps may be performed by additional or other modules or entities, which may be combined or separated to form other modules or entities. Further, non-dependent acts may be performed in parallel. Also, the term "user", as used herein, is intended to be broadly interpreted to include, for example, a computer or data processing system or a human user of a computer or data processing system, unless otherwise stated.

Further, certain embodiments of the disclosure may be implemented as logic that performs one or more functions. This logic may be hardware-based, software-based, or a combination of hardware-based and software-based. Some or all of the logic may be stored in one or more tangible non-transitory computer-readable storage media and may include computer-executable instructions that may be executed by a computer or data processing system, such as system 1300. The computer-executable instructions may include instructions that implement one or more embodiments of the disclosure. The tangible non-transitory computer-readable storage media may be volatile or non-volatile and may include, for example, flash memories, dynamic memories, removable disks, and non-removable disks.

No element, act, or instruction used herein should be construed as critical or essential to the disclosure unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

The foregoing description has been directed to specific embodiments of the present disclosure. It will be apparent, however, that other variations and modifications may be made to the described embodiments, with the attainment of some or all of their advantages. For example, while functionality of a model is illustrated as being graphically linked to exposed access points of an adaptation layer interface, in other embodiments, functionality of the model may be linked in other ways, such as textually. Therefore, it is the object of the appended claims to cover all such variations and modifications as come within the true spirit and scope of the disclosure.

What is claimed is:

1. A method comprising:
    for an executable model comprising model elements and links between the model elements, where
        a plurality of the model elements and a plurality of the links are defined by a programming language and the plurality of the model elements and the plurality of the links form executable entities of the executable model,
        behaviors of the plurality of the model elements and the plurality of the links comprise computational implementations implicitly defined by the programming language, and
        the executable model is in a first graphical presentation form that includes the plurality of the model elements and the plurality of the links,
    analyzing, by one or more processors, the executable model and the computational implementations;
    automatically determining based on the analyzing, by the one or more processors, adjustable attributes of the executable entities of the executable model that are adjustable without changing a structure of the computational implementations, the adjustable attributes having predefined features based on which the executable entities of the executable model are executed;
    extracting, by the one or more processors, at least one of the adjustable attributes for presenting with the executable model in a second graphical presentation form of the model that includes other model elements and other links and is different from the first graphical presentation form of the executable model, where the at least one of the adjustable attributes is an entry point through which execution of a given executable entity of the executable model is invoked, and has a corresponding predefined feature;
    generating an interface for inclusion within the second graphical presentation form for the executable model;

presenting the at least one of the adjustable attributes explicitly at the interface included within the second graphical presentation form of the executable model to allow adjusting the at least one of the adjustable attributes to have a feature different from the corresponding predefined feature, wherein the adjusting is realized through logic explicitly included in the second graphical presentation form of the executable model, the logic represented by the one or more of the other model elements of the executable model connected to the at least one of the adjustable attributes;

and generating an execution schedule for the given executable entity, the execution schedule indicated by the logic explicitly included in the second graphical presentation form of the executable model, wherein at least a portion of the logic explicitly included in the second graphical presentation form of the executable model implements a first call style that differs from a second call style associated with the given executable entity and the first call style or the second call style includes at least one of:

(i) rate-based, (ii) event-based, (iii) function-call, or (iv) triggered.

2. The method of claim 1, wherein the given executable entity comprises one or more of the plurality of the model elements or the plurality of the links.

3. The method of claim 2, wherein the analyzing the model and the computational implementations comprises partitioning the execu table model to determine a plurality of the executable entities included in the executable model.

4. The method of claim 2, wherein the interface is adjusted to be invoked through one or more explicit events or one or more implicit events.

5. The method of claim 4, wherein the one or more explicit events are function calls or messages, and the one or more implicit events are trigger signals or periodic timers.

6. The method of claim 2, wherein a first executable entity is at a first level of a hierarchy within the executable model and a second executable entity is at a second level of the hierarchy within the executable model that is different than the first level of the hierarchy, and wherein a first interface of the first executable entity and a second interface of the second executable entity are adjusted to be invoked by a single mechanism or the first interface and the second interface are adjusted to be invoked by two mechanisms that are different from each other.

7. The method of claim 1, further comprising presenting the at least one of the adjustable attributes within the executable model in the second graphical presentation form.

8. The method of claim 1, further comprising generating code for the executable model, wherein the code comprises a section that corresponds to the extracted at east one of the adjustable attributes.

9. The method of claim 1, wherein the adjustable attributes include a second adjustable attribute, wherein the second adjustable attribute represents a type of service utilized by the given executable entity, and the type of service includes timing services, error handling services, or data transfer services.

10. A method comprising:
for a graphical model component that includes executable entities, partitioning the graphical model component into the plurality of executable entities;
automatically identifying based on an analysis of the graphical model component one or more adjustable attributes of at least one of the plurality of executable entities, where the one or more adjustable attributes include an entry point for invoking execution of the at least one of the plurality of executable entities;
establishing, by one or more processors, an adaptation layer for the graphical model component, where the adaptation layer includes one or more access points that correspond to the one or more the adjustable attributes of the at least one of the plurality of executable entities;
presenting the one or more access points included in the adaptation layer through one or more graphical affordances included within a graphical model;
binding to the entry point, by the one or more processors, logic explicitly included in the graphical model and linked to the one or more graphical affordances which correspond to the one or more adjustable attributes of the at least one of the plurality of executable entities, wherein at least a portion of the logic explicitly included in the graphical model and linked to the one or more graphical affordances implements a first call style that differs from a second call style associated with the at least one of the plurality of executable entities and the first call style or the second call style includes at least one of: (i) rate-based, (ii) event-based, (iii) function-call, or (iv) triggered; and at least one of
utilizing the logic explicitly included in the graphical model and linked to the one or more graphical affordances to generate an execution schedule for the at least one of the plurality of executable entities, or
generating code for the graphical model component, wherein the generated code includes one or more code sections implementing the logic explicitly included in the graphical model and linked to the one or more graphical affordances to generate the execution schedule for the at least one of the plurality of executable entities.

11. The method of claim 10, wherein the execution schedule is indicated by the logic explicitly included in the graphical model and linked to the graphical affordances.

12. The method of claim 11, further comprising:
coordinating the execution schedule with an exchange of data with the graphical model component.

13. The method of claim 10, wherein the logic explicitly included in the graphical model and linked to the graphical affordances is user-specified.

14. The method of claim 13, wherein the user-specified logic is included in a parent model that includes the graphical model component, and the user-specified logic is graphically connected to the graphical affordances through which the access points are exposed.

15. The method of claim 14, further comprising:
coordinating an exchange of data between the parent model and the model component.

16. The method of claim 10, wherein the graphical model component is included in a model having hierarchical levels and the graphical model component is included in a second graphical model component that is in a higher hierarchical level than the graphical model component, the method further comprising:
aggregating a given access point of the graphical model component with an access point of the second graphical model component that includes the graphical model component.

17. The method of claim 13, wherein the user-specified logic is implemented through a plurality of model elements.

18. A method comprising:
for an executable graphical model comprising model elements and links between the model elements, where a plurality of the model elements and a plurality of the links are defined by a programming language and the plurality of the model elements and the plurality of the links form executable entities, and behaviors of the plurality of the model elements and the plurality of the links comprise computational implementations implicitly defined by the programming language, automatically identifying, by one or more processors, based on an analysis of the executable graphical model, adjustable attributes of the executable entities of the executable graphical model for adjusting without changing a structure of the computational implementations, the adjustable attributes having predefined features based on which the executable entities of the executable graphical model are executed, the adjustable attributes presentable at an adaptation layer interface included within the executable graphical model through which the adjustable attributes are adjusted based on one or more of the model elements of the executable graphical model being connected to the adjustable attributes, wherein the adjustable attributes include entry points for invoking execution of the executable entities, and at least one of the adjustable attributes has a corresponding predefined feature, and is adjusted through logic represented by the one or more of the model elements of the executable graphical model connected to the at least one of the adjustable attributes to have a feature different from the corresponding predefined feature;

generating, by the one or more processors, code for the executable graphical model, the code comprises one or more first code sections corresponding to the adjustable attributes, one or more second code sections corresponding to the computational implementations, and generating an execution schedule for the executable entities, the execution schedule indicated by the logic represented by the one or more of the model elements of the executable graphical model connected to the at least one of the adjustable attributes, wherein at least a portion of the logic represented by the one or more of the model elements of the executable graphical model connected to the at least one of the adjustable attributes implements a first call style that differs from a second call style associated with at least one of the executable entities and the first call style or the second call style includes at least one of:

(i) rate-based, (ii) event-based, (iii) function-call, or (iv) triggered.

19. A method comprising:
automatically identifying, based on an analysis of a graphical model component, adjustable attributes of a plurality of executable entities of the graphical model component, where the adjustable attributes include entry points for invoking execution of the plurality of executable entities, and an adaptation layer selectively presentable at the graphical model component, where the adaptation layer includes access points for the adjustable attributes of the plurality of executable entities, the adjustable attributes adjusted based on logic explicitly represented by one or more model elements of a graphical model that are connected to the access points presented at the adaptation layer; and generating, by at least one processor, code for the graphical model component, the code including one or more code sections implementing an execution schedule for the plurality of executable entities, where the execution schedule is indicated by logic explicitly represented by the one or more model dements connected to the access points, wherein at least a portion of the logic explicitly represented by the one or more model elements connected to the access points implements a first call style that differs from a second call style associated with at least one of the plurality of executable entities and the first call style includes at least one of:

(i) rate-based, (ii) event-based, (iii) function-call, or (iv) triggered.

20. The method of claim 19, wherein the access points are visually represented with the graphical model component.

21. The method of claim 1, wherein the programming language is a declaratory language.

22. The method of claim 18, wherein the programming language is a declaratory language.

23. A method comprising:
automatically identifying, based on an analysis of a graphical model component, adjustable attributes of a plurality of executable entities of the graphical model component, where the adjustable attributes include entry points for invoking execution of the plurality of executable entities, and an adaptation layer selectively presentable at the graphical model component, where the adaptation layer includes access points for the adjustable attributes of the plurality of executable entities, the adjustable attributes adjusted based on logic explicitly represented by one or more model elements of a graphical model that are connected to the access points presented at the adaptation layer; and at least one of
utilizing the logic explicitly represented by the one or more model elements of the graphical model that are connected to the access points presented at the adaptation layer, by a first processor, to generate an execution schedule for the plurality of executable entities, or generating, by the first processor or a second processor, code for the graphical model component, the code including one or more code sections implementing the execution schedule for the plurality of executable entities, wherein the execution schedule is indicated by logic explicitly represented by the one or more model elements connected to the access points, and at least a portion of the logic explicitly represented by the one or more model elements connected to the access points implements a first call style that differs from a second call style associated with at least one of the plurality of executable entities and the first call style includes at least one of:

(i) rate-based, (ii) event-based, (iii) function-call, or (iv) triggered.

24. One or more non-transitory computer-readable media, having stored thereon instructions that when executed by a computing device, cause the computing device to perform operations comprising:

for an executable model comprising model elements and links between the model elements, where a plurality of the model elements and a plurality of the links are defined by a programming language and the plurality of the model elements and the plurality of the links form executable entities of the executable model, behaviors of the plurality of the model elements and the plurality of the links comprise computational implementations implicitly defined by the programming language, and the executable model is in a first graphical presentation form that includes the plurality of the model elements and the plurality of the links, analyzing the executable model and the computational implementations;

automatically determining based on the analyzing adjustable attributes of the executable entities of the executable model that are adjustable without changing a structure of the computational implementations, the adjustable attributes having predefined features based on which the executable entities of the executable model are executed;

extracting at least one of the adjustable attributes for presenting with the executable model in a second graphical presentation form of the model that includes other model elements and other links and is different from the first graphical presentation form of the executable model, where the at least one of the adjustable attributes is an entry point through which execution of a given executable entity of the executable model is invoked, and has a corresponding predefined feature;

generating an interface for inclusion within the second graphical presentation form of the executable model;

presenting the at least one of the adjustable attributes explicitly at the interface included within the second graphical presentation form of the executable model to allow adjusting the at least one of the adjustable attributes to have a feature different from the corresponding predefined feature, wherein the adjusting is realized through logic explicitly included in the second graphical presentation form of the executable model, the logic represented by the one or more of the other model elements of the executable model connected to the at least one of the adjustable attributes; and generating an execution schedule for the given executable entity, the execution schedule indicated by the logic explicitly included in the second graphical presentation form of the executable model, wherein at least a portion of the logic explicitly included in the second graphical presentation form of the executable model implements a first call style that differs from a second call style associated with the given executable entity and the first call style or the second call style includes at least one of:

(i) rate-based, (ii) event-based, (iii) function-call, or (iv) triggered.

25. The one or more non-transitory computer-readable media of claim 24, wherein a first executable entity is at a first level of a hierarchy within the executable model and a second executable entity is at a second level of the hierarchy within the executable model that is different than the first level of the hierarchy, and wherein a first interface of the first executable entity and a second interface of the second executable entity are adjusted to be invoked by a single mechanism or the first interface and the second interface are adjusted to be invoked by two mechanisms that are different from each other.

26. one or more non-transitory computer-readable media of claim 24, wherein the executable model is part of a parent model having hierarchical levels and the executable model is included in a second executable model included in the parent model, the second executable model at a higher hierarchical level than the executable model, wherein the instructions cause the computing device to perform further operations comprising:

aggregating information associated with the interface of the executable model with information associated with an interface of the second executable model that includes the executable model.

27. One or more non-transitory computer-readable media, having stored thereon instructions that when executed by a computing device, cause the computing device to perform operations comprising:

for a graphical model component that includes executable entities, partitioning the graphical model component into the plurality of executable entities;

automatically identifying based on an analysis of the graphical model component one or more adjustable attributes of at least one of the plurality of executable entities, where the one or more adjustable attributes include an entry point for invoking execution of the at least one of the plurality of executable entities;

establishing an adaptation layer for the graphical model component, where the adaptation layer includes one or more access points that correspond to the one or more the adjustable attributes of the at least one of the plurality of executable entities;

presenting the one or more access points included in the adaptation layer through one or more graphical affordances included within a graphical model;

binding to the entry point logic explicitly included in the graphical model and linked to the one or more graphical affordances which correspond to the one or more adjustable attributes of the at least one of the plurality of executable entities, wherein at least a portion of the logic explicitly included in the graphical model and linked to the one or more graphical affordances implements a first call style that differs from a second call style associated with the at least one of the plurality of executable entities and the first call style or the second call style includes at least one of: (i) rate-based, (ii) event-based, (iii) function-call, or (iv) triggered; and at least one of utilizing the logic explicitly included in the graphical model and linked to the one or more graphical affordances to generate an execution schedule for the at least one of the plurality of executable entities, or generating code for the graphical model component, wherein the generated code includes one or more code sections implementing the logic explicitly included in the graphical model and linked to the one or more graphical affordances to generate the execution schedule for the at least one of the plurality of executable entities.

28. The one or more non-transitory computer-readable media of claim 27, wherein a first executable entity of the graphical model component is at a first level of a hierarchy within the graphical model component and a second executable entity of the graphical model component is at a second level of the hierarchy within the graphical model component that is different than the first level of the hierarchy, and further wherein a first adaptation layer for the first executable entity and a second adaptation layer for the second executable entity are adjusted to be invoked by a single mechanism or the first adaptation layer and the second adaptation layer are adjusted to be invoked by two mechanisms that are different from each other.

29. The one or more non-transitory computer-readable media of claim 27, wherein the graphical model component includes a second adaptation layer that includes a second access point, the adaptation layer and the second adaptation layer at different hierarchical levels of the graphical model component, further wherein the instructions cause the computing device to perform further operations comprising:
  aggregating the one or more access points included in the adaptation layer with the second access point included in the second adaptation layer.

30. One or more non-transitory computer-readable media, having stored thereon instructions that when executed by a computing device, cause the computing device to perform operations comprising:
  for an executable graphical model comprising model elements and links between the model elements, where
    a plurality of the model elements and a plurality of the links are defined by a programming language and the plurality of the model elements and the plurality of the links form executable entities, and
    behaviors of the plurality of the model elements and the plurality of the links comprise computational implementations implicitly defined by the programming language,
  automatically identifying, based on an analysis of the executable graphical model, adjustable attributes of the executable entities of the executable graphical model for adjusting without changing a structure of the computational implementations, the adjustable attributes having predefined features based on which the executable entities of the executable graphical model are executed, the adjustable attributes presentable at an adaptation layer interface included within the executable graphical model through which the adjustable attributes are adjusted based on one or more of the model elements of the executable graphical model being connected to the adjustable attributes, wherein
    the adjustable attributes include entry points for invoking execution of the executable entities, and
    at least one of the adjustable attributes has a corresponding predefined feature, and is adjusted through logic represented by the one or more of the model elements of the executable graphical model connected to the at least one of the adjustable attributes to have a feature different from the corresponding predefined feature;
  generating code for the executable graphical model, the code comprises one or more first code sections corresponding to the adjustable attributes, one or more second code sections corresponding to the computational implementations, and
  generating an execution schedule for the executable entities, the execution schedule indicated by the logic represented by the one or more of the model elements of the executable graphical model connected to the at least one of the adjustable attributes, wherein at least a portion of the logic represented by the one or more of the model elements of the executable graphical model connected to the at least one of the adjustable attributes implements a first call style that differs from a second call style associated with at least one of the executable entities and the first call style or the second call style includes at least one of:
    (i) rate-based, (ii) event-based, (iii) function-call, or (iv) triggered.

31. The one or more non-transitory computer-readable media of claim 30, wherein the executable graphical model is part of a parent model having hierarchical levels and the executable graphical model is included in a second executable graphical model included in the parent model, the second executable graphical model (i) including adjustable attributes presentable at a second adaptation layer interface and (ii) at a higher hierarchical level than the executable graphical model, and further wherein the adaptation layer interface of the executable graphical model and the second adaptation layer interface of the second executable graphical model are adjusted to be invoked by a single mechanism or the adaptation layer interface of the executable graphical model and the second adaptation layer interface of the second executable graphical model are adjusted to be invoked by two mechanisms that are different from each other.

32. one or more non-transitory computer-readable media of claim 30, wherein the executable graphical model is part of a parent model having hierarchical levels and the executable graphical model is included in a second executable graphical model included in the parent model, the second executable graphical model (i) including adjustable attributes presentable at a second adaptation layer interface and (ii) at a higher hierarchical level than the executable graphical model, and further wherein the instructions cause the computing device to perform further operations:
  aggregating information associated with the adaptation layer interface of the executable graphical model with information associated with the second adaptation layer interface of the second executable graphical model.

33. One or more non-transitory computer-readable media, having stored thereon instructions that when executed by a computing device, cause the computing device to perform operations comprising:
  automatically identifying based on an analysis of a graphical model component adjustable attributes of a plurality of executable entities of the graphical model component, where
    the adjustable attributes include entry points for invoking execution of the plurality of executable entities, and
    an adaptation layer selectively presentable at the graphical model component, where the adaptation layer includes access points for the adjustable attributes of the plurality of executable entities, the adjustable attributes adjusted based on logic explicitly represented by one or more model elements of a graphical model that are connected to the access points presented at the adaptation layer; and
  generating code for the graphical model component, the code including one or more code sections implementing an execution schedule for the plurality of executable entities, where the execution schedule is indicated by logic explicitly represented by the one or more model elements connected to the access points, wherein at least a portion of the logic explicitly represented by the one or more model elements connected to the access points implements a first call style that differs from a second call style associated with at least one of the plurality of executable entities and the first call style includes at least one of:
    (i) rate-based, (ii) event-based, (iii) function-call, or (iv) triggered.

34. The one or more non-transitory computer-readable media of claim 33, wherein a first executable entity of the graphical model component is at a first level of a hierarchy within the graphical model component and a second executable entity of the graphical model component is at a second level of the hierarchy within the graphical model component that is different than the first level of the hierarchy, and further wherein a first adaptation layer for the first executable entity and a second adaptation layer for the second executable entity are adjusted to be invoked by a single mechanism or the first adaptation layer and the second adaptation layer are adjusted to be invoked by two mechanisms that are different from each other.

35. The one or more non-transitory computer-readable media of claim 33, wherein the graphical model component includes a second adaptation layer that includes a second access point, the adaptation layer and the second adaptation layer at different hierarchical levels of the graphical model component, further wherein the instructions cause the computing device to perform further operations comprising:
aggregating one or more of the access points included in the adaptation layer with the second access point of the second adaptation layer.

36. One or more non-transitory computer-readable media, having stored thereon instructions that when executed by a computing device, cause the computing device to perform operations comprising:
automatically identifying based on an analysis of a graphical model component adjustable attributes of a plurality of executable entities of the graphical model component, where
the adjustable attributes include entry points for invoking execution of the plurality of executable entities, and
an adaptation layer selectively presentable at the graphical model component, where the adaptation layer includes access points for the adjustable attributes of the plurality of executable entities, the adjustable attributes adjusted based on logic explicitly represented by one or more model elements of a graphical model that are connected to the access points presented at the adaptation layer; and
at least one of
utilizing the logic explicitly represented by the one or more model elements of the graphical model that are connected to the access points presented at the adaptation layer to generate an execution schedule for the plurality of executable entities, or
generating code for the graphical model component, the code including one or more code sections implementing the execution schedule for the plurality of executable entities,
wherein the execution schedule is indicated by logic explicitly represented by the one or more model elements connected to the access points, and at least a portion of the logic explicitly represented by the one or more model elements connected to the access points implements a first call style that differs from a second call style associated with at least one of the plurality of executable entities and the first call style includes at least one of:
(i) rate-based, (ii) event-based, (iii) function-call, or (iv) triggered.

37. An apparatus comprising:
one or more memories configured to store a graphical model component that includes executable entities; and
one or more processors coupled to the one or more memories, the one or more processors configured to:
partition the graphical model component into the plurality of executable entities;
automatically identify based on an analysis of the graphical model component one or more adjustable attributes of at least one of the plurality of executable entities, where the one or more adjustable attributes include an entry point for invoking execution of the at least one of the plurality of executable entities;
establish an adaptation layer for the graphical model component, where the adaptation layer includes one or more access points that correspond to the one or more the adjustable attributes of the at least one of the plurality of executable entities;
present the one or more access points included in the adaptation layer through one or more graphical affordances included within a graphical model;
bind to the entry point logic explicitly included in the graphical model and linked to the one or more graphical affordances which correspond to the one or more adjustable attributes of the at least one of the plurality of executable entities, wherein at least a portion of the logic explicitly included in the graphical model and linked to the one or more graphical affordances implements a first call style that differs from a second call style associated with the at least one of the plurality of executable entities and the first call style or the second call style includes at least one of: (i) rate-based, (ii) event-based, (iii) function-call, or (iv) triggered; and
at least one of
utilize the logic explicitly included in the graphical model and linked to the one or more graphical affordances to generate an execution schedule for the at least one of the plurality of executable entities, or
generate code for the graphical model component, wherein the generated code includes one or more code sections implementing the logic explicitly included in the graphical model and linked to the one or more graphical affordances to generate the execution schedule for the at least one of the plurality of executable entities.

* * * * *